United States Patent

Mergenthaler et al.

[11] Patent Number: 6,122,577
[45] Date of Patent: Sep. 19, 2000

[54] DEVICE AND METHOD TO MONITOR SENSORS IN VEHICLES

[75] Inventors: Rolf-Hermann Mergenthaler, Leonberg; Werner Urban, Vaihingen/Enz; Asmus Volkart, Bietigheim-Bissingen, all of Germany

[73] Assignee: Robert Bosch GmbH, Stuttgart, Germany

[21] Appl. No.: 09/051,569

[22] PCT Filed: Jul. 4, 1997

[86] PCT No.: PCT/DE97/01410

§ 371 Date: Aug. 5, 1998

§ 102(e) Date: Aug. 5, 1998

[87] PCT Pub. No.: WO98/10297

PCT Pub. Date: Mar. 12, 1998

[30] Foreign Application Priority Data

Sep. 7, 1996 [DE] Germany .............. 196 36 443

[51] Int. Cl.[7] .................................................. G06F 7/00
[52] U.S. Cl. .............................. 701/34; 701/41; 180/197
[58] Field of Search ................................ 701/34, 38, 41, 701/70; 180/197, 233, 248, 249, 252

[56] References Cited

U.S. PATENT DOCUMENTS

| | | | |
|---|---|---|---|
| 5,126,942 | 6/1992 | Matsuda | 180/197 |
| 5,163,530 | 11/1992 | Nakamura et al. | 180/197 |
| 5,270,930 | 12/1993 | Ito et al. | 701/69 |
| 5,320,076 | 6/1994 | Reppich et al. | 123/399 |
| 5,368,120 | 11/1994 | Sakai et al. | 180/197 |
| 5,557,520 | 9/1996 | Suissa et al. | 364/424.01 |
| 5,617,337 | 4/1997 | Eidler et al. | 364/551.01 |
| 5,842,143 | 11/1998 | Lohrenz et al. | 701/34 |

FOREIGN PATENT DOCUMENTS

| | | |
|---|---|---|
| 35 13937 | 10/1986 | Germany . |
| 39 34 723 | 4/1991 | Germany . |
| 40 06 948 | 9/1991 | Germany . |
| 40 19 393 | 12/1991 | Germany . |
| 40 40 219 | 6/1992 | Germany . |
| 41 33 571 | 4/1993 | Germany . |
| 42 30 295 | 3/1994 | Germany . |
| 43 25 413 | 2/1995 | Germany . |
| 43 30 312 | 3/1995 | Germany . |
| 43 35 700 | 4/1995 | Germany . |
| 44 22 039 | 1/1996 | Germany . |
| 44 36 372 | 4/1996 | Germany . |
| 195 10 525 | 9/1996 | Germany . |
| 06298503 | 6/1996 | Japan . |

OTHER PUBLICATIONS

V. Raab et al., "Digitale Regelung und Überwachung von Kraftfahzeugaktoren", ATZ 95, 1993, pp. 90–96.

N. Waleschkowski et al. "Wissensmodellierung und Wissenserwerb am Beispiel der Fahrzeugdiagnose", Anwendungen Jan. 1995, pp. 55–61.

V. Zanten et al., "FDR—Die Fahrdynamik–regelung von Bosch", ATZ 96, 1994, pp. 674–689.

*Primary Examiner*—William A. Cuchlinski, Jr.
*Assistant Examiner*—Gertrude Arthur
*Attorney, Agent, or Firm*—Kenyon & Kenyon

[57] ABSTRACT

The apparatus is used for monitoring sensors in a vehicle which generate signals each representing different physical variables. The apparatus contains a first arrangement with which, for at least two sensors and on the basis at least of the signals generated by them, comparison variables defined identically for the sensors are determined. The apparatus also includes a second arrangement with which, as a function of at least the determined comparison variables, a reference variable is determined. On the basis of at least the determined reference variable, a monitoring operation for at least one sensor is performed in a third arrangement. In addition to the third arrangement, the apparatus further includes a fourth arrangement with which, for at least one sensor, a correction of the signal generated by the fourth arrangement is performed, at least as a function of the reference variable.

29 Claims, 15 Drawing Sheets

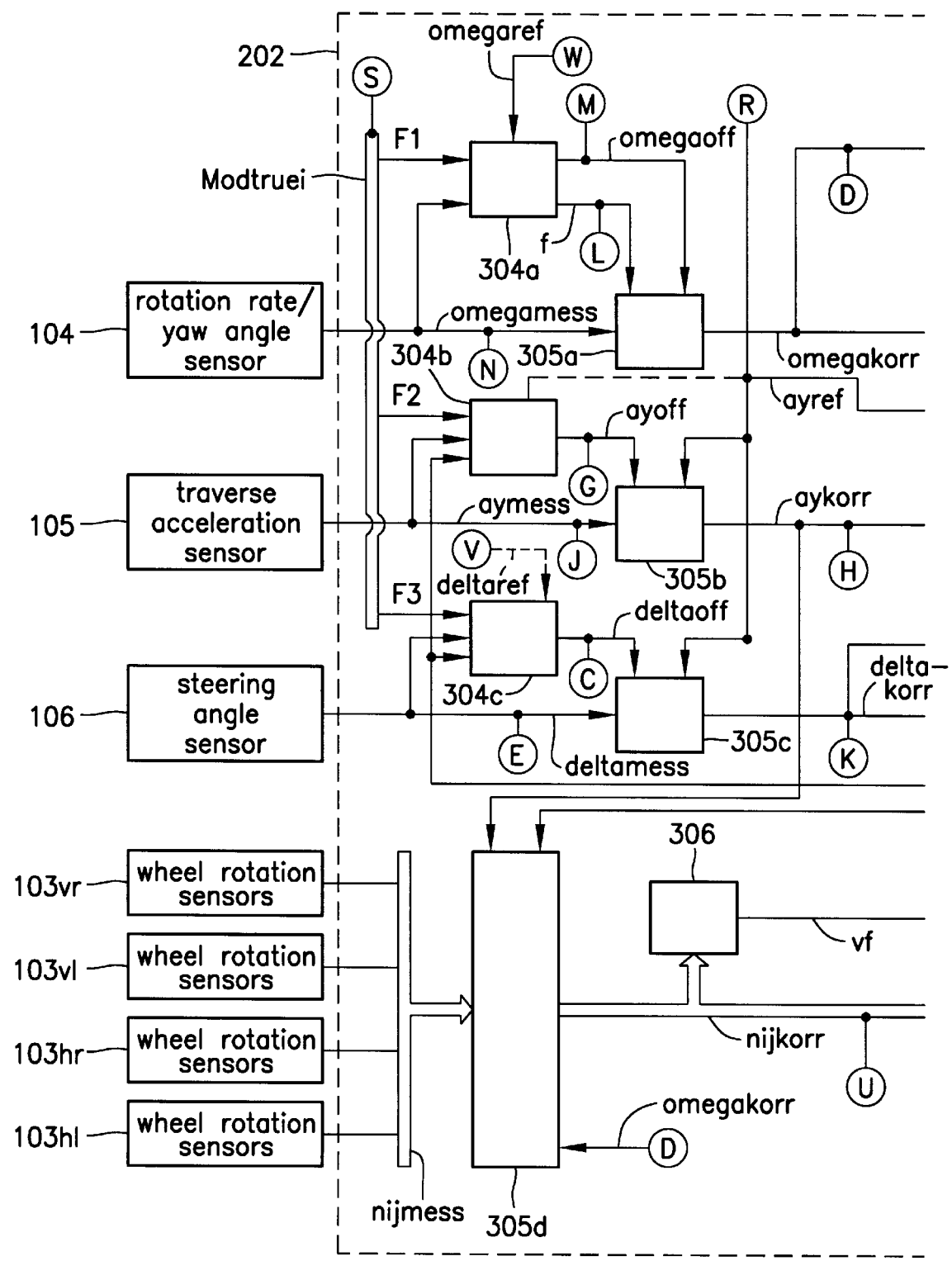
Fig. 4a.1

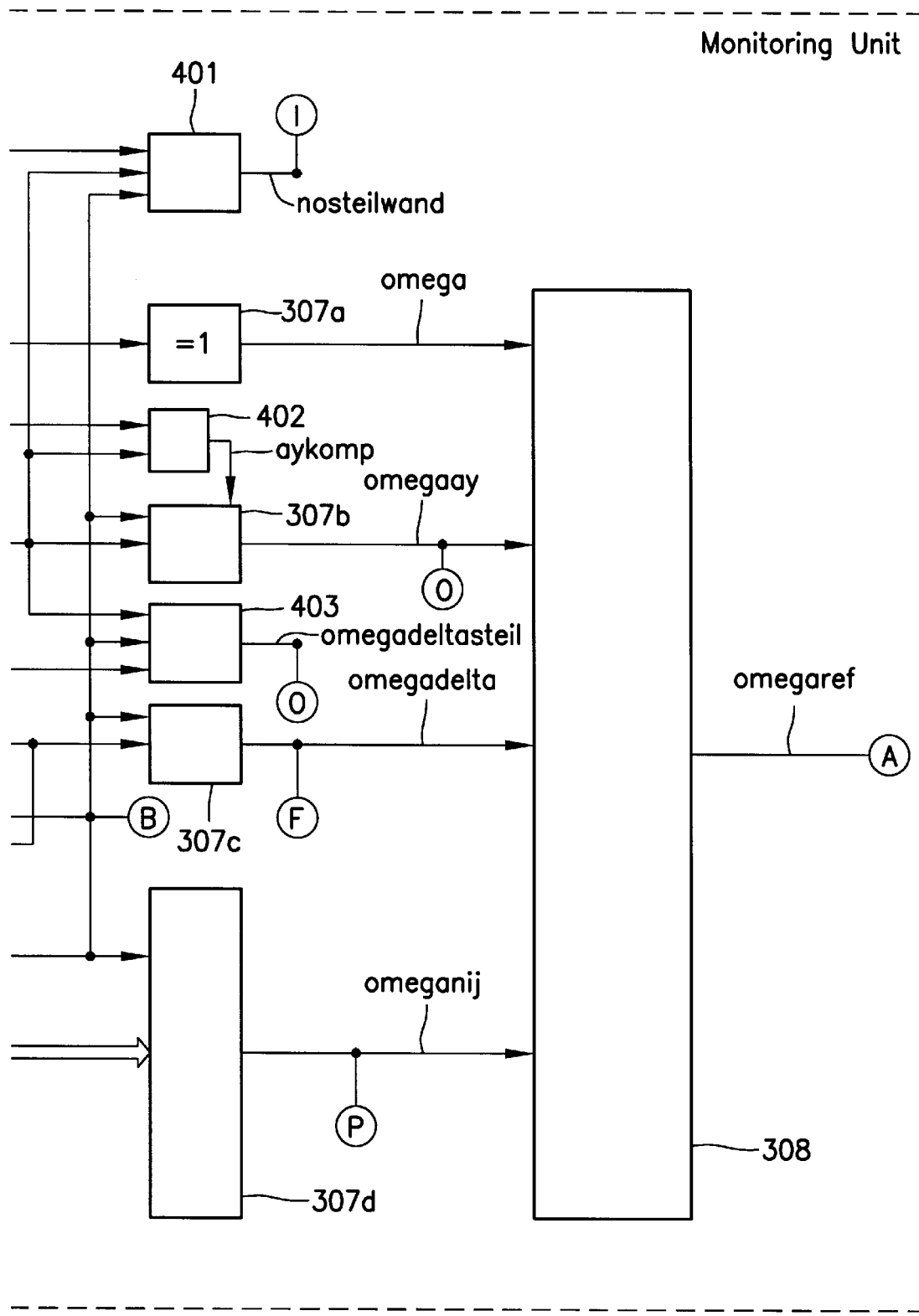
Fig. 4a.2

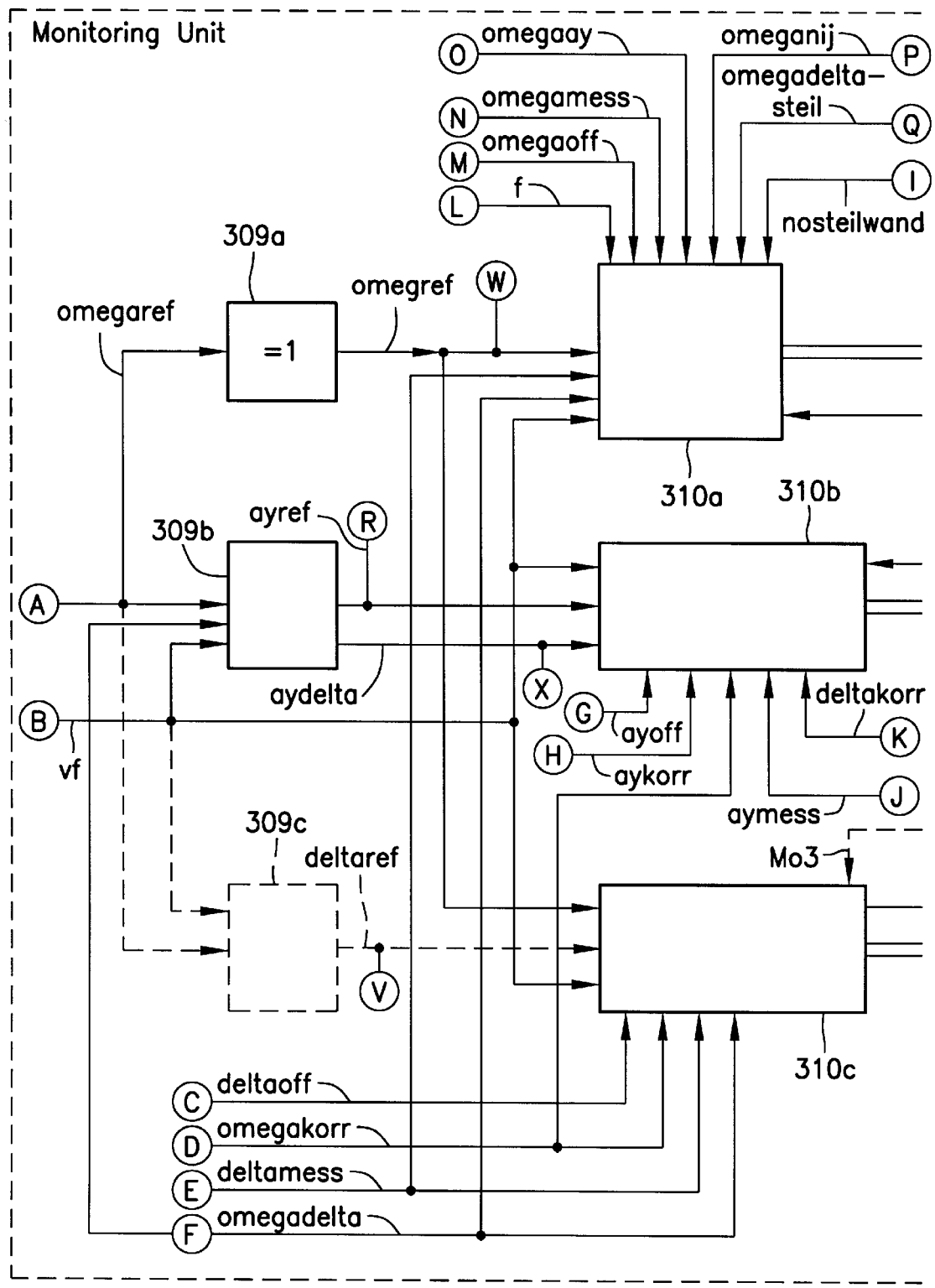
Fig. 4b.1

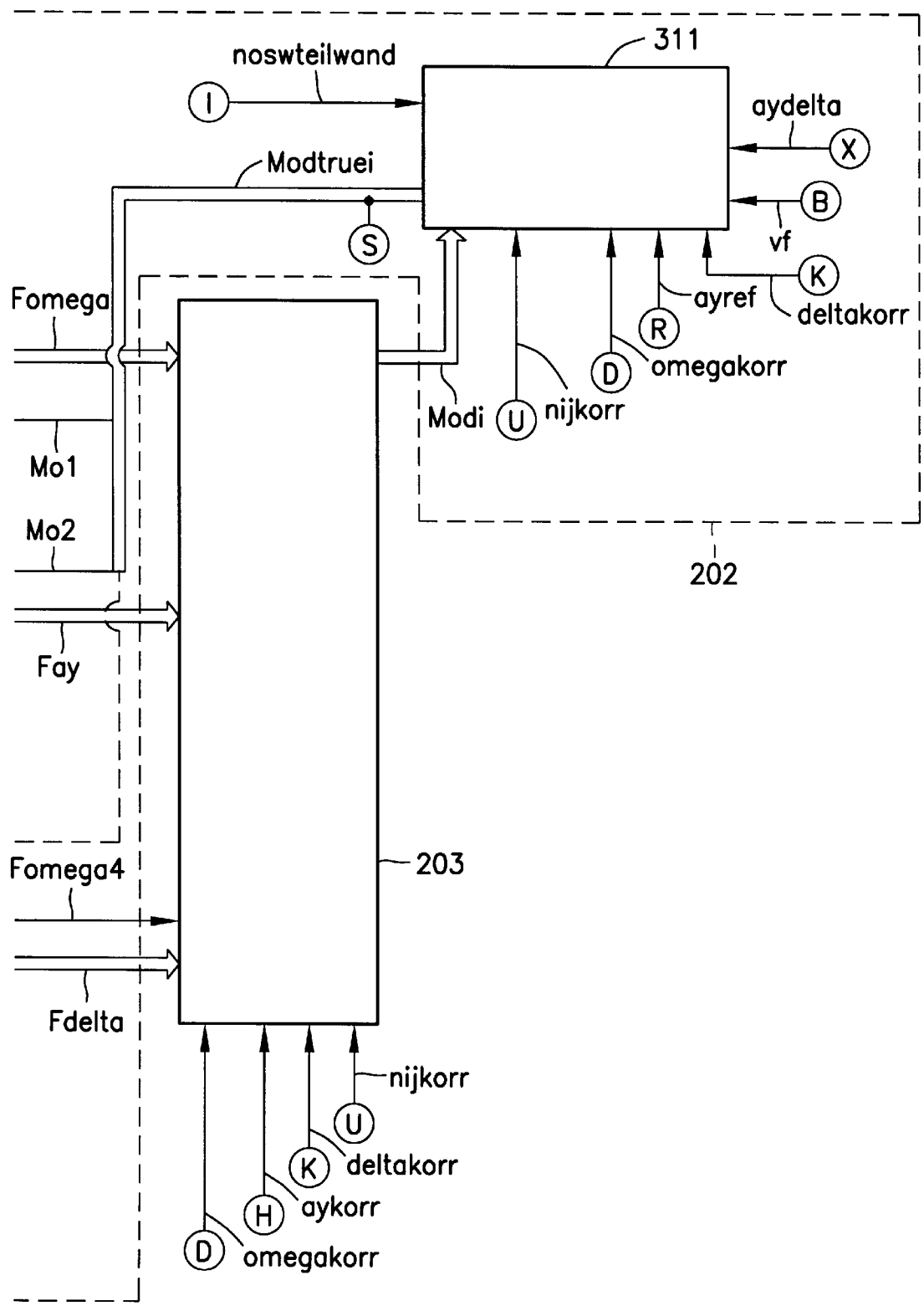
Fig. 4b.2

DEVICE AND METHOD TO MONITOR SENSORS IN VEHICLES

FIELD OF THE INVENTION

The present invention relates to an apparatus and to a method for monitoring sensors used in a vehicle. The apparatus and method serve, in particular, for monitoring sensors which are used in a system for controlling the operating dynamics of a vehicle.

Apparatuses and methods for monitoring sensors used in a vehicle are known from the existing art in numerous modifications.

BACKGROUND INFORMATION

German Patent Application No. 35 13 937 describes a method for monitoring a rotation speed sensor signal in which the rotation speed sensor signal is tested not only terms of its presence, but additionally with regard to its plausibility. Plausibility monitoring of the rotation speed sensor signal, which is present as a pulse train, takes place by the fact that on the basis of the rotation speed sensor signal, a time value is determined which describes the time interval between the individual pulses of the current rotation speed sensor signal. Limit values which depend in each case at least on the last rotation speed sensor signal are defined for the current time value. If the current time value exceeds those limit values upward or downward, the monitoring system recognizes that the current rotation speed sensor signal is not reasonable and that a fault in the rotation speed sensor therefore exists. If, on the other hand, the current time value lies within the defined limits, the rotation speed sensor signal is forwarded for further processing.

German Patent Application No. 195 10 525.7 describes a method and an apparatus for controlling or regulating the braking system of a vehicle. With this method and apparatus, brake pedal actuation is sensed by at least two measurement devices, preferably different in nature. In a preferred implementation, for example, the first measurement device senses the distance traveled by the pedal, and the second measurement device senses the actuation force exerted by the driver on the pedal. In an error recognition system provided in the method and the apparatus, the signal representing the pedal travel and the signal representing the pedal force are first tested for plausibility. This is done by comparing the respective signal amplitude or respective signal gradient with a corresponding threshold. If these plausibility comparisons indicate that both sensor signals are plausible, a desired braking force on the vehicle center of gravity that represents the driver's braking input is calculated in each case on the basis of both the signal representing the pedal travel and the signal representing the pedal force. The difference between the two braking force values is compared with a defined threshold. If the difference is less than the defined threshold, it can then be assumed that the system for determining braking input is operating correctly, and that the sensors are also fault-free. If the result, however, is either that the sensor signals are not plausible or that the difference determined from the braking signals is greater than the defined threshold, an examination is made as to which of the two sensors is faulty. This examination is performed with reference to the braking forces determined from the two sensor signals and a reference variable determined from the signal of a third sensor. On the basis of the deviations of the respective braking force from the reference variable, a determination is made as to which of the two sensors is faulty.

Systems for regulating the operating dynamics of a vehicle are known, for example from the publication "FDR—die Fahrdynamikregelung von Bosch", (FDR—the vehicle dynamics regulation system from Bosch) in Automobiltechnische Zeitschrift (ATZ) 96, 1994, Vol. 11, on pages 674–689. This publication also shows that a sensor monitoring system can be implemented by testing, in a model calculation, whether or not the correlations between the signals determined via the vehicle motion are being violated. In addition, this publication shows that the model can also be used to calculate and compensate for the sensor offsets occurring within sensor specifications.

It is the object of the present invention to improve the monitoring of sensors used in a vehicle and the correction of the signals generated by sensors used in a vehicle.

SUMMARY OF THE INVENTION

One of the advantages of the present invention is that with the apparatus and method according to the present invention for monitoring the sensors used in a vehicle and for correcting the signals generated by the sensors, no further, i.e. redundant sensors are necessary. To allow redundant sensors to be dispensed with, for this purpose the signals generated by the sensors contained in the vehicle, which each represent different physical variables, are delivered to means with which, for at least two sensors and on the basis of the signals generated by the sensors, comparison variables defined identically for the sensors are determined. In further means, a reference variable is determined as a function of at least the determined comparison variables. On the basis of this reference variable, a monitoring operation is performed for at least one sensor. In addition, for at least one sensor, a correction of the signal generated by it is performed in a further means, at least as a function of the reference variable.

For determining the reference variable, it is advantageous to determine the reference variable by means of a comparison of the comparison variables. This is done by preferably making a determination of at least the comparison variable which is at the greatest possible spacing from the most recently determined reference variable. Because it can be assumed, on the basis of the greatest spacing, that the pertinent sensor is obviously faulty, this comparison variable is omitted from consideration when the reference variable is determined. Advantageously, the reference variable is determined on the basis of the spacings existing between the comparison variables and on the basis of the comparison variables themselves, by forming a weighted average.

With an arrangement generating for at least one sensor, a correction of the signal generated, a determination is made, as a function of the signal generated by respective sensor, of a signal representing the offset of that signal. On the basis of that signal and the signal generated by the sensor, a corrected signal of the sensor is determined. This corrected signal is used to determine the comparison variable for the respective sensor.

A further advantageous embodiment provides that the means for monitoring at least the one sensor additionally contain means with which, for that sensor, at least as a function of the reference variable, and preferably using an inverse mathematical model, a sensor reference variable applicable to the respective sensor is determined. This sensor reference variable is incorporated into the monitoring operation of the sensor. In addition, the sensor reference variable is preferably delivered to the correction means, and is thus available for correction of the signal generated by the sensor. A sensor-specific reference variable is thus available both during monitoring of the at least one sensor and during correction of the signal generated by at least one sensor.

Another advantageous embodiment provides the two fault analysis means contained, at least for one sensor, in the monitoring means. With a first fault analysis means, a first sensor fault can be determined at least as a function of the signal which represents the offset of the signal generated by the sensor being monitored. With a second fault analysis means—to which at least the signal generated by the sensor being monitored, the sensor reference variable, and additionally at least one signal which represents a permissible sensor-specific deviation, are delivered—a second sensor fault can be determined. Two different sensor faults can consequently be detected, independently of one another, by the two fault analysis means.

Determination of the comparison variables that are defined identically for the sensors is advantageously accomplished with the use of mathematical models that can be tested for validity.

Advantageously, the apparatus and method according to the present invention can be used in a system for regulating the operating dynamics of a vehicle. In this case the sensor suite to be monitored is, for example, a first sensor which generates a signal representing the yaw velocity, a second sensor which generates a signal representing the transverse acceleration of the vehicle, a third sensor which generates a signal representing the steering angle, and fourth sensors, associated with the wheels of the vehicle, which generate signals representing the respective wheel rotation speeds or wheel velocities.

It is also advantageous if the identically defined comparison variables which are determined represent a physical variable that preferably corresponds to a variable sensed with one of the sensors contained in the vehicle. In this case, for the sensor whose sensed physical variable corresponds to the identically defined comparison variables, processing of the signal generated by it in a mathematical or inverse mathematical model is not absolutely necessary. If the apparatus and method according to the present invention are used in a system for regulating the operating dynamics of a vehicle, it is advantageous to use the yaw velocity, in particular, as the physical variable for the identically defined comparison variables.

It is further advantageous if the reference variable which is determined represents a physical variable which preferably corresponds to a variable sensed with one of the sensors contained in the vehicle. It is particularly advantageous if the identically defined comparison variables and the reference variable which is determined represent the same physical variable.

BRIEF DESCRIPTION OF THE DRAWINGS

FIG. 4a shows a first embodiment of the apparatus according to the present invention used in a system for regulating operating dynamics of a vehicle.

FIG. 4b shows a second embodiment of the apparatus according to the present invention used in the system for regulating the operating dynamics of the vehicle.

DETAILED DESCRIPTION OF THE DRAWINGS

An embodiment illustrating a use of an apparatus and method according to the present invention in a system for regulating the operating dynamics of a vehicle—is not intended to constitute any limitation on the present invention.

Figure 1:
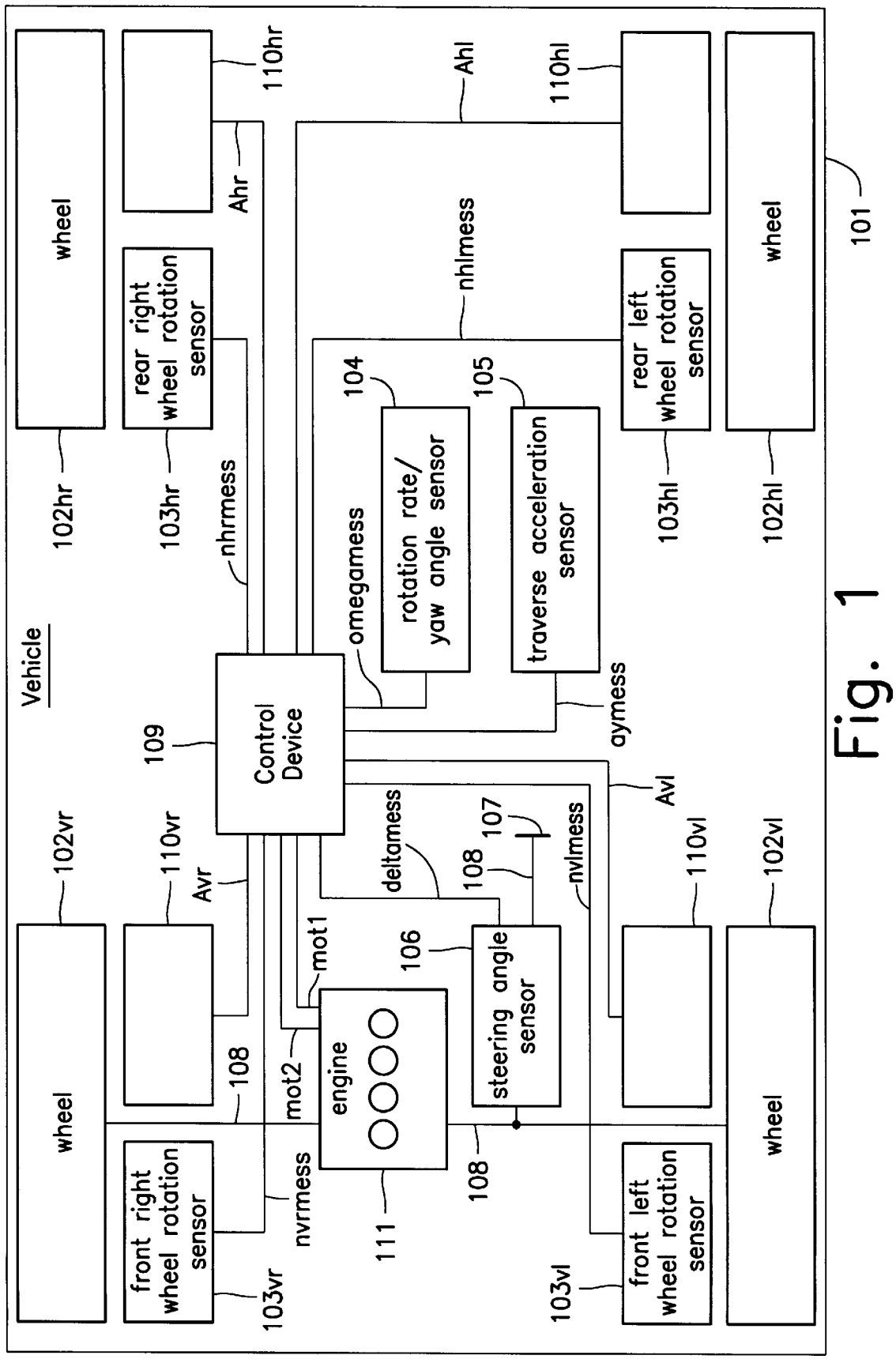
FIG. 1 shows an exemplary system in a vehicle for regulating vehicle dynamics.

FIG. 1 shows a vehicle 101 having wheels 102$vr$, 102$vl$, 102$hr$, and 102$hl$. The simplified notation 102$ij$ will be referred to hereinafter for the wheels of the vehicle, the index i indicating whether the wheel is located on the rear axle (h) or front axle (v), and the index j indicating association with the right (r) or left (l) side of the vehicle. This characterization by means of the two indices i and j is analogous for all variables or components for which it is utilized.

A wheel rotation speed sensor 103$ij$ is assigned to each wheel 102$ij$. The signal nijmess generated by the respective wheel rotation speed sensor 103$ij$ is delivered to control device 109. In addition to wheel rotation speed sensors 103$ij$, further sensors are present in vehicle 101. These include a rotation rate or yaw rate sensor 104, the signal omegamess of which is also delivered to control device 109. These also include a transverse acceleration sensor 105; generating a signal aymess to be delivered to control device 109. Also contained in the vehicle is a steering angle sensor 106 with which the steering angle established by the driver at the front wheels, via steering wheel 107 and steering linkage 108, is sensed. The signal deltamess generated by steering angle sensor 106 is delivered to control device 109. In addition, current engine characteristic data mot2, for example engine speed and/or throttle valve position and/or ignition angle, are delivered from engine 111 to control device 109.

In control device 109, the signals delivered to control device 109 are processed and analyzed, and actuating signals are output in accordance with the system for regulating the operating dynamics of the vehicle. It is conceivable for control device 109 to generate actuating signals Aij with which actuators 110$ij$, which are associated with wheels 102$ij$ and are preferably brakes, can be influenced. Also conceivable is the output of an actuating signal mot1 with which the drive torque output by engine 111 can be influenced.

Figure 2:
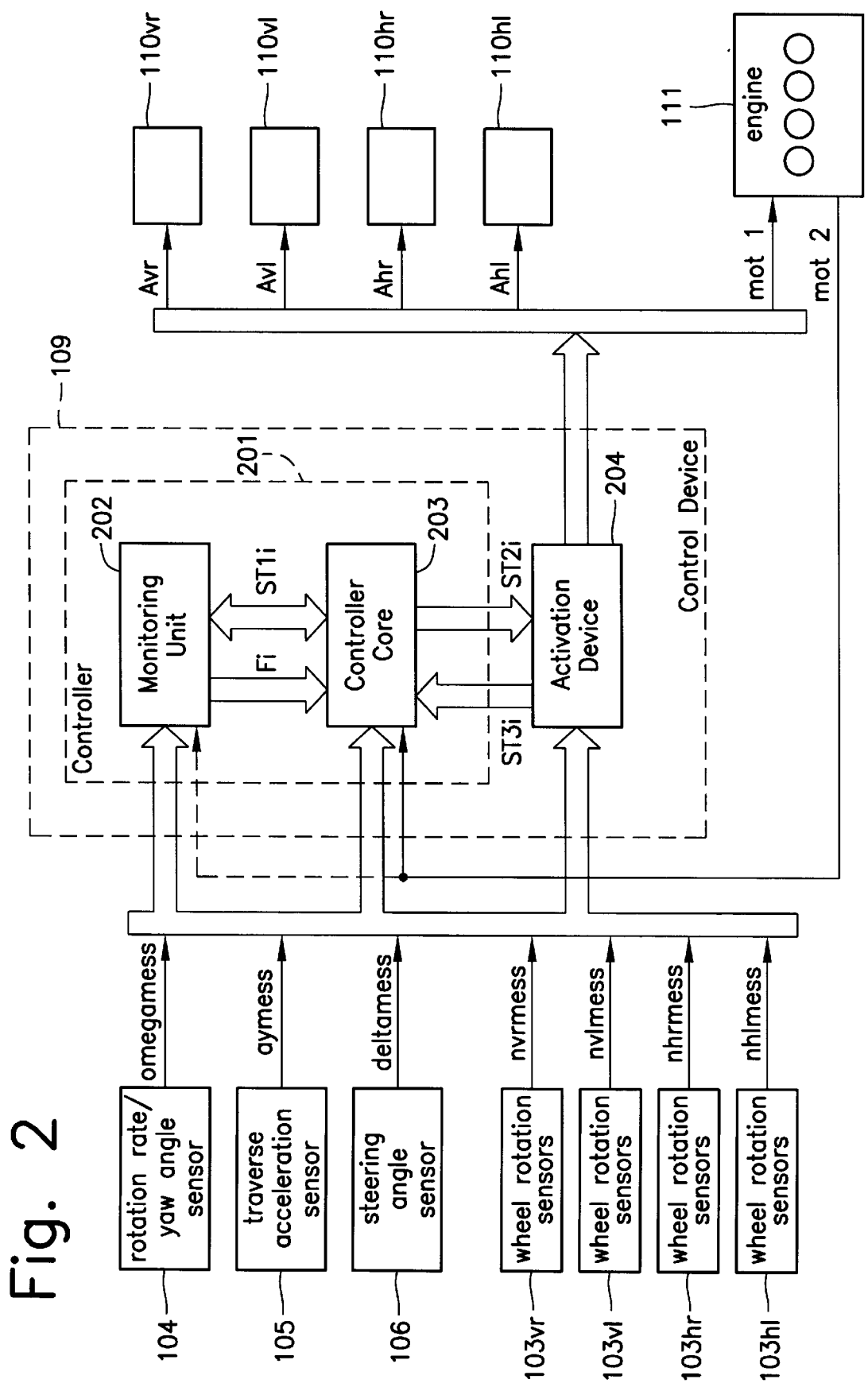
FIG. 2 shows a sensor suite and an actuator suite used in a system for regulating the operating dynamics of a vehicle, a structure of the control device used in the system illustrated in FIG. 1.

FIG. 2 shows the layout of control device 109 relevant to the apparatus and method according to the present invention. Control device 109 consists substantially of a controller 201 and an activation device 204 for the actuators. Controller 201 includes a monitoring unit 202 and a controller core 203. The signals generated by sensors 103$ij$, 104, 105, and 106 are delivered to monitoring unit 202 for monitoring of those sensors. In addition, depending on the implementation of controller core 203, these signals can also be delivered to controller core 203. Engine characteristic data mot2 of engine 111 are also delivered to controller core 203. Optionally, these can also be fed to monitoring unit 202. Control signals ST1i are exchanged between monitoring unit 202 and controller core 203. For example, signals necessary for testing the sensor monitoring operation that is being performed can be fed to monitoring unit 202 from controller core 203. At the same time, for example, correction values with which the respective sensor signals are to be corrected can be transmitted to controller core 203 from monitoring unit 202. With signals Fi, controller core 203 obtains from monitoring unit 202 information as to which sensor is faulty.

On the basis of the signals delivered to controller core 203, controller core 203 generates activation signals ST2i which are delivered to activation device 204 for the actuators. At the same time, controller core 203 obtains from activation device 204 the actuators signals ST3i which inform controller core 203, for example, of the status of the activation device. As a function of the signals ST2i received, activation device 204 for the actuators generates signals Aij which are applied to actuators 110$ij$. In addition, activation device 204 for the actuators generates signals mot1 with which engine 111, or the torque output by the engine, is influenced.

Figure 3:
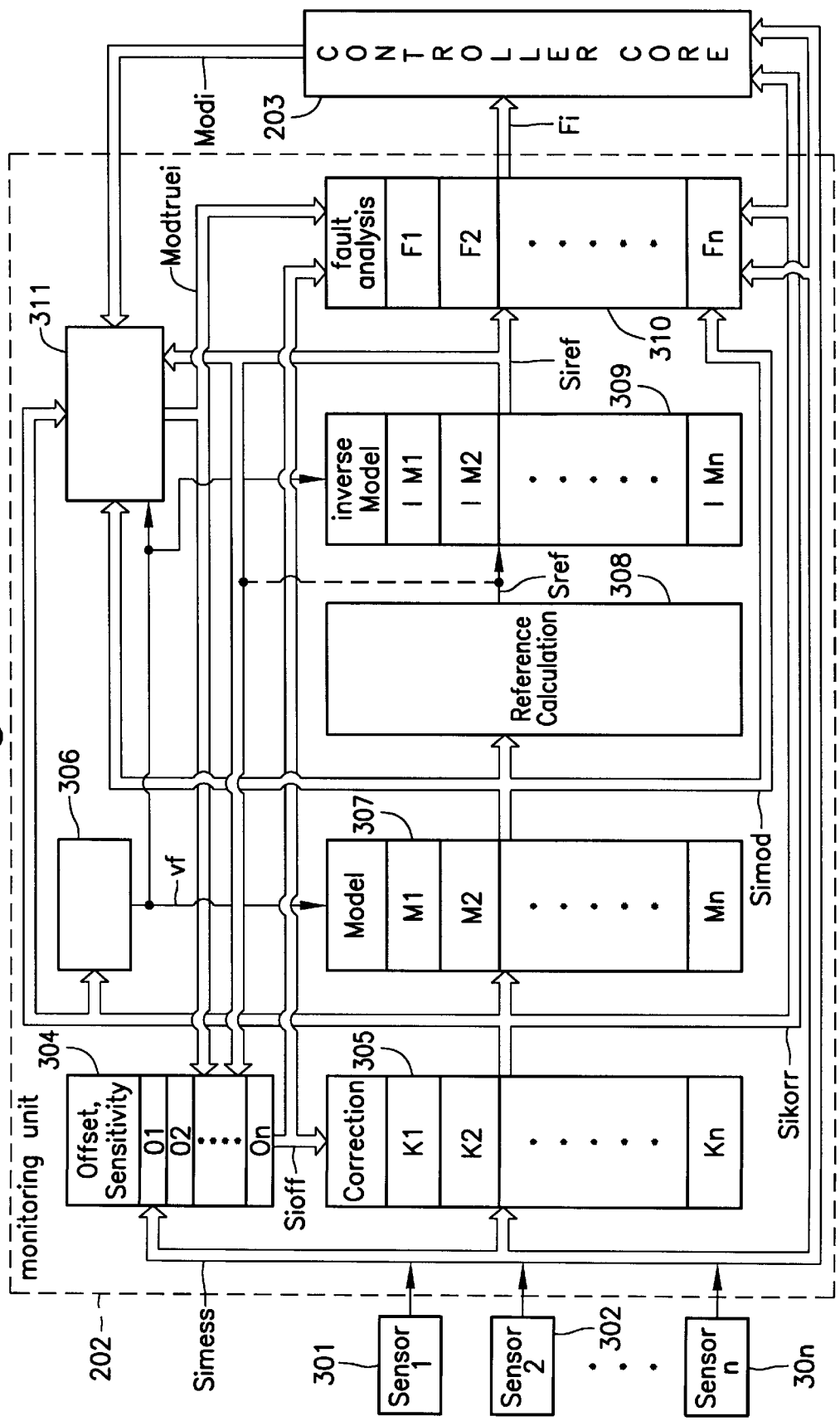
FIG. 3 shows a synoptic block diagram of an apparatus according to the present invention configured for any desired number of sensors and for any desired sensor.

FIG. 3 shows an exemplary layout of monitoring unit 202, which is independent of the sensor configuration contained in the vehicle, and independent of the control system used for the vehicle. This general layout of monitoring unit 202 substantially reflects the layout of monitoring unit 202 shown in FIGS. 4$a$ and 4$b$, for the system for regulating the operating dynamics of the vehicle. There may nevertheless be differences, in the signals delivered to the individual blocks, between the general illustration in FIG. 3 and the more concrete illustration in FIGS. 4$a$ and 4$b$. FIGS. 4$a$ and 4$b$ also shows additional blocks which are not depicted in FIG. 3.

For monitoring unit 202 shown in FIG. 3, it is assumed that n sensors 301, 302 to 30$n$ contained in the vehicle are to be monitored. It should be noted in this context that on the one hand, all n sensors contained in the vehicle can generally be monitored with monitoring unit 202. On the other hand, however, it is also conceivable to monitor only a portion of the n sensors with monitoring unit 202.

Signals Simess generated by the n sensors 301, 302 to 30$n$ are delivered to blocks 304, 305, 310, and 203. On the basis of the sensor signals Simess that are generated, and taking into account the offset signals Sioff generated in block 304 (the corresponding signal Sioff representing the offset of the pertinent signal Simess), corrected sensor signals Sikorr are generated in block 305. For this, a correction means is present, for example in block 305, for each of the n sensors. Signals Sikorr generated in block 305 are delivered to blocks 306, 307, 310, 311, and also to block 203.

The assumed sensor configuration, consisting of n sensors, is also intended to contain the wheel rotation speed sensors associated with the wheels, with which signals are generated that represent the respective wheel velocity. Consequently, corrected wheel velocity signals are also contained in corrected signals Sikorr of the sensors. A signal vf representing the vehicle velocity can consequently be generated in block 306 as a function of corrected signals Sikorr of the sensors. This signal is delivered to blocks 307, 309, and 311.

The identically defined comparison variables Simod are determined in block 307, at least as a function of corrected sensor signals Sikorr and signal vf representing the vehicle velocity. Determination of these comparison variables Simod is performed in block 307, preferably with the use of mathematical models. It is advantageous, in this context, to use a different mathematical model for each of the n sensors. Comparison variables Simod, defined identically for the sensors, are delivered to blocks 308, 310, and 311.

On the basis of at least comparison variables Simod defined identically for the sensors, a reference variable Sref is determined in block 308. Reference variable Sref can be determined, for example with the use of suitable weighting methods, from comparison variables Simod. Reference variable Sref is delivered to a block 309. Optionally, it can also be delivered to a block 304.

In block 309, sensor reference variables Siref valid for the respective sensors are determined, preferably with the use of inverse mathematical models and at least on the basis of reference variable Sref and vehicle velocity vf. It is also true for block 309, by analogy with block 307, that either an individual inverse mathematical model is used for each of the n sensors, or, in some circumstances, the same inverse mathematical model can be used for multiple sensors. Sensor reference variables Siref are delivered to blocks 304, 310, and 311.

In block 310, a fault analysis takes place for each of the n sensors. This is done, in block 310, by analyzing the respective signals Sioff which represent the offset of the signal generated by the respective sensor, the respective sensor reference variables Siref, the respective corrected sensor signals Sikorr, and the respective comparison variable Simod for the n sensors. The fault analysis is also influenced by signals Modtruei, which inform block 310, for example, as to whether the models being used in block 307 are valid. The fault analysis taking place in block 310 for the sensors can take place, for example, on the basis of a comparison between sensor reference variables Siref and corrected sensor signals Sikorr.

For each of the n sensors, a signal Fi is generated in block 310 and is fed to block 203. Signals Fi indicate whether a sensor is faulty, and which sensor is faulty.

On the basis of signals Fi delivered to controller core 203, a corresponding processing of the signals deriving from the sensors takes place in controller core 203. If signals Fi indicate to controller core 203 that none of the sensors is faulty, then all the signals deriving from the sensors can be processed in controller core 203. If, on the other hand, signals Fi inform controller core 203 that a certain sensor is faulty, then in some circumstances a branching in the fault handling routines may take place. In such a case, for example, controller core 203 may transition to a state such that the signal generated by the faulty sensor is no longer taken into account in determining the variables necessary for the control system. It would also be conceivable for controller core 203 to transition into an emergency mode, specified for the particular control system implemented in the vehicle, which in some circumstances may go so far as to shut down the control system. It is also conceivable for driver to be informed of the existence of a faulty sensor.

Proceeding from block (controller core) 203, signals Modi, which can be taken into account in determining whether the mathematical or inverse mathematical models being used are valid, can be delivered to block 311. These signals Mod1 can, for example, be signals which contain information regarding the power supply for individual components present in the control device, or information about, for example, short circuit or shunts which are occurring.

Multiple delivery and processing variants exist with regard to the signals delivered to controller core 203 and deriving from the n sensors. One variant consists in delivering to controller core 203 signals Simess generated by the sensors, as well as offset signals Sioff. The corrected sensor signals can thus be independently determined in the controller core 203. Another variant of the present invention delivers only the corrected sensor signals Sikorr to controller core 203.

Based on signals Sikorr, Simod, Siref, and Modi delivered to block 311, and vehicle velocity vf, a determination is made in that block as to whether the mathematical models being used in block 307, or the inverse mathematical models being used in block 309, are valid. The test taking place in block 311 can, for example, be based on plausibility queries which are performed on the basis of corrected sensor signals Sikorr. The result of this test is delivered to blocks 304 and 310.

As described above, signals Sioff representing the offset of the respective signal are determined in block 304. This is done by delivering to block 304, as input variables, signals Simess determined by the sensors, sensor reference variables Siref, and signals Modtruei. Signals Sioff can, for example, be generated by filtration from signals Simess generated by the sensors. Signals Sioff are delivered both to block 305 and to block 310.

In addition to the generation of signals Sioff which represent the respective offset of signals Simess generated by the sensors, signals which represent the sensitivity of the individual sensors can also be generated in block 304.

FIG. 3 shows means specific for each of the n sensors provided in blocks 304, 305, 307, 309, and 310. It is, however, entirely conceivable for one means also to be used for multiple sensors in these blocks.

FIG. 3 also shows that the method according to the present invention executed in the apparatus according to the present invention is a cyclical method. This is evident, for example, from the fact that sensor reference variables Siref are incorporated into the determination of signals Sioff. Signals Sioff are in turn incorporated into the determination of signals Sikorr, on the basis of which sensor reference variables Siref are determined.

Blocks 304 and 305 can be considered in terms of their functions, as means with which, at least for one sensor, a correction of the signal generated by each of the blocks 304 and 305 is performed. Means 309 and 310 can likewise be considered, as means with which monitoring can be performed at least for one sensor.

FIGS. 4a and 4b show an exemplary layout of monitoring unit 202 as used, for example, in a control device for regulating the operating dynamics of a vehicle. The exemplary embodiment depicted with reference to FIGS. 4a and 4b is not intended to constitute any limitation on the apparatus or method according to the present invention. It should be noted in addition that the general layout of monitoring unit 202 is shown in FIG. 3. To this extent, differences may exist between FIG. 3 and FIGS. 4a and 4b, for example with regard to the blocks used or the signals delivered to the blocks.

Signal omegamess generated by rotation rate sensor 104 is delivered both to a block 304a and to a block 305a. In block 304a, firstly signal omegaoff, which represents the offset of signal omegamess generated by sensor 104, is determined. Also determined in block 304a is a signal f which represents the sensitivity of rotation rate sensor 104. Both signal omegaoff and signal f are delivered to a block 305a.

Further signals in addition to signal omegamess are delivered to block 304a. On the one hand, these include a signal F1 which is generated in a block 311 and which contains information at least as to whether the mathematical or inverse mathematical models being used possess validity. Depending on the method used in block 304a for determining the variable omegaoff, signal F1 can contain additional information necessary for the respective method. Also delivered to block 304a is a signal omegaref, generated in a block 309a, which constitutes the sensor reference variable for rotation rate sensor 104.

If block 304a is informed, via signal F1, that the mathematical or inverse mathematical models being used possess validity, variables omegaoff and f are then determined from variables omegamess and omegaref, respectively. Both for determination of the sensitivity f of rotation rate sensor 104, and for the determination of variable omegaoff (the offset of signal omegamess generated by rotation rate sensor 104), it is possible to use, for example, a parameter estimation method in which both variables are estimated on the basis of signals omegamess and omegaref. Variable f can, for example, as an alternative to the parameter estimation method, also be determined on the basis of a comparison between variables omegamess and omegaref by means of an iterative process. In the iterative process, an attempt is made to equalize variable omegamess with variable omegaref by varying variable f. The iterative process is complete as soon as variable omegamess has been equalized with variable omegaref. As an alternative to the parameter estimation method for variable omegaoff, the latter can be determined, for example, by filtration using variables omegamess and/or omegaref.

If block 304a is informed, via signal F1, that the mathematical or inverse mathematical models being used are not valid, then, for example, the values most recently determined for variables f and omegaref can be retained until the mathematical or inverse mathematical models once again possess validity.

It is conceivable for multiple methods for determining variables f and omegaoff to be installed in block 304a. The method which appears most suitable at the time can be activated as a function of the particular vehicle state, for example via signal F1.

A corrected signal omegakorr is constituted in block 305a on the basis of variables omegamess, f, and omegaoff. This is done, for example, by determining the deviation between signals omegamess and omegaoff, and evaluating said deviation with sensitivity f.

Signal omegakorr generated in block 305a is delivered both to a block 307a and to a block 401.

In the present exemplary embodiment according to the present invention, it can be assumed that the comparison variables defined identically for the sensors represent, as the physical variable, a yaw velocity. For this reason, the mathematical model implemented in block 307a is a multiplication by 1, since corrected variable omegakorr does not need to be converted. Consequently, in this case variables omegakorr and omega are identical. For the case in which the comparison variables defined identically for the sensors are to represent a different physical variable, however, a mathematical model with which variable omegakorr can be correspondingly converted into the requisite physical variable must be implemented in block 307a. Signal omega generated in block 307a is delivered to a block 308.

Signal aymess generated by transverse acceleration sensor 105 is delivered both to a block 304b and to a block 305b.

In addition to signal aymess, a signal F2 generated by block 311, and a signal vf (which represents the vehicle velocity) generated in a block 306, are delivered to block 304b. Optionally, the sensor reference signal ayref generated by a block 309b can be delivered to block 304b. Corresponding to signal F1, signal F2 also contains at least information as to whether the mathematical or inverse mathematical models being used possess validity. If validity exists for them, signal ayoff, which represents the offset of signal aymess generated by transverse acceleration sensor 105, is determined in block 304b. A number of methods are possible for the determination of signal ayoff. For example, signal ayoff can be determined from signal aymess by means of a long-period filtration; the filter time can be selected, for example, as a function of vehicle velocity vf. Alternatively, signal ayoff can be determined, for example, on the basis of the deviation of variables ayref and aymess. For the case in which differing methods for determining variable ayoff are implemented in block 304b, the method most suitable in the current situation can be selected, based on the operating status of the vehicle, by means of signal F2. Signal ayoff generated in block 304b is delivered to block 305b.

If block 304b is informed, via signal F2, that the mathematical or inverse mathematical models being used are not valid at the time, execution proceeds in accordance with the procedure of block 304a.

In addition to variables aymess and ayoff, sensor reference variable ayref, generated in a block 309b, is also delivered to block 305b. In block 305b, the corrected transverse acceleration aykorr is determined by filtration, for example on the basis of the deviation between the variables aymess and ayoff. Taking variable ayref into consideration in filtration corrects for disturbing influences on transverse acceleration, caused for example by roll motions of the vehicle. Signal aykorr generated by block 305b is delivered, among others, to blocks 401, 402, 307b, and 403.

In addition to signal aykorr, variable ayref is also delivered to block 402 as a further input signal. At block 402, on the basis of signals aykorr and ayref, a signal aykomp is determined which is based on the deviation between signals ayref and aykorr. Signal aykomp can be used to correct for an uncompensated transverse acceleration offset.

Signal aykomp generated by block 402 is delivered to block 307b. Block 307b also receives the vehicle velocity vf generated in block 306. On the basis of signals aykorr and aykomp, and taking into consideration vehicle velocity vf, a comparison variable omegaay is determined in block 307b using a mathematical model. It is advantageous in this context to perform a filtration when determining variable omegaay. Signal omegaay generated by block 307b is delivered to block 308.

Signal deltamess generated by steering angle sensor 106 is delivered both to a block 304c and to a block 305c. In addition to signal deltamess, block 304c receives a signal F3 generated by block 311, as well as vehicle velocity vf generated in block 306 and optionally a sensor reference variable deltaref generated in block 309c. On the basis of these input signals, a signal deltaoff, which represents the offset of signal deltamess generated by the steering angle sensor, is generated in block 304c.

Variables F1, F2, and F3 are part of signals Modtruei, which are generated in block 311.

The determination of signal deltaoff executed in block 304c can take place by analogy with the determination of signal ayoff executed in block 304b. Signal deltaoff determined in block 304c is delivered to a block 305c.

In addition to signals deltamess and deltaoff, signal ayref is also delivered to block 305c. Based on the deviation between signals deltamess and deltaoff, and taking into account the steering elasticity which can be described as a function of variable ayref, the corrected signal deltakorr is constituted in block 305c. Filtration of signal deltakorr may be advantageous here.

Signal deltakorr generated in block 305c is delivered on the one hand to a block 403 and on the other hand to a block 307c. As a further input variable, block 307c receives signal vf generated in block 306. Based on the corrected steering angle signal deltakorr, and taking into consideration vehicle velocity vf, a comparison variable omegadelta is determined in block 307c using a mathematical model. This variable is delivered to block 308.

Signals nijmess, generated by wheel rotation speed sensors 103ij and representing the wheel rotation speeds, are delivered to a block 305d. Block 305d also receives, as further input variables, signal omegakorr generated in block 305a, signal aykorr generated in block 305b, and signal deltakorr generated in block 305c. On the basis of signals nijmess, the corrected wheel velocities nijkorr are determined in block 305d. For example, in order to determine the corrected wheel velocities nijkorr, signals nijmess representing the wheel rotation speeds are first converted into wheel velocities, which are then filtered. Then, on the basis of these filtered variables and taking into consideration variables omegakorr, aykorr, and deltakorr, the corrected wheel velocities nijkorr are determined. The method described in German Patent Application No. 42 30 295 can be used, for example, for this. The corrected wheel velocities represent essentially free-rolling wheel velocities with no tire diameter tolerances.

The corrected wheel velocities nijkorr generated by means of block 305d are delivered both to a block 306 and to a block 307d. On the basis of signals nijkorr, signal vf representing the vehicle velocity is generated in block 306, for example by averaging. Signal vf is delivered, among others, to blocks 307b, 307c, 307d, 401, and 401.

In block 307d, on the basis of the corrected wheel velocities nijkorr and taking into consideration vehicle velocity vf, a comparison variable omeganij is determined by means of a mathematical model. This is delivered to block 308.

On the basis of the comparison variables omega, omegaay, omegadelta, and omeganij delivered to block 308, a reference variable omegaref is determined by a comparison of said comparison variables. A suitable way to determine reference variable omegaref is, for example, first to determine those comparison variables which have the greatest spacing from the most recently determined reference variable. Since these comparison variables have the greatest spacing from the most recently determined reference variable, it can be concluded that in some circumstances, the pertinent sensor may be faulty. This comparison variable is consequently left out of consideration when determining the current reference variable.

The current reference variable is constituted by taking a weighted average. The remaining comparison variables on the one hand, and the spacings existing between the remaining comparison variables on the other hand, are taken into account in constituting the weighted average. Reference variable omegaref is delivered, among others, to blocks 309a, 309b, and 309c.

A banked curve detection operation takes place in block 401 on the basis of signals omegakorr, aykorr, and vf. This can be done, for example, by converting the corrected yaw velocity omegakorr into a transverse acceleration, taking into account vehicle velocity vf. On the basis of a comparison between the converted transverse acceleration and corrected transverse acceleration aykorr, it can be ascertained whether the vehicle is driving on a banked curve. If so, the value FALSE is assigned to signal nosteilwand. Signal nosteilwand is delivered to blocks 310a and 311.

In a block 403, a yaw velocity omegadeltasteil, which takes into consideration the influences of transversely sloping road surfaces, is calculated on the basis of variables deltakorr, aykorr, and vf using a mathematical model. This variable omegadeltasteil is delivered to a block 310a. Regarding the yaw velocity omegadeltasteil, it should be noted that it is unsuitable for monitoring of the sensors, since it depends on the signals of two sensors (transverse acceleration sensor 105 and steering angle sensor 106). It is therefore used solely to prevent incorrect shutdowns of the yaw velocity monitoring system when the road surface slopes transversely.

In the present exemplary embodiment, reference variable omegaref determined in block 308 represents a physical variable which corresponds to a variable, namely the yaw rate, sensed with one of the sensors contained in the vehicle. For this reason, the sensor reference variable determined in block 309a for rotation rate sensor 104 is identical to reference variable omegaref. In other words, a multiplication by 1 is used in block 309a as the inverse mathematical model for determining the sensor reference variable on the basis of the reference variable. For cases in which the identically defined comparison variables do not correspond to the yaw rate as physical variable, an inverse mathematical model other than multiplication by 1 must be used in block 309a to determine the sensor reference variable for rotation rate sensor 104. Sensor reference variable omegaref determined in block 309a is delivered to a block 310a.

In block 310a, monitoring of rotation rate sensor 104 takes place. For this purpose, further variables in addition to sensor reference variable omegaref are delivered to block 310a. These are variable f which represents the sensitivity of rotation rate sensor 104, variable omegaoff which represents the offset of the signal generated by the rotation rate sensor, signal omegamess generated by the rotation rate sensor, comparison variable omegaay, comparison variable omeganij, signal deltamess generated by the steering angle sensor, comparison variable omegadelta, vehicle velocity vf, signal omegadeltasteil, signal nosteilwand, and a signal Mo1 generated by block 311. On the basis of these input variables, block 310a generates signals Fomega, which contains information as to whether rotation rate sensor 104 is faulty. These signals are delivered to controller core 203.

On the basis of reference variable omegaref, and taking into consideration vehicle velocity vf, a sensor reference variable ayref applicable to transverse acceleration sensor 105 is determined in block 309b by means of an inverse mathematical model. This variable is delivered to a block 310b. Correspondingly in block 309b, a variable aydelta is determined on the basis of comparison variable omegadelta and vehicle velocity vf, using an inverse mathematical model, and is also delivered to block 310b. The two variables—both sensor reference variable ayref and variable aydelta—are used in the monitoring of transverse acceleration sensor 105 which takes place in block 310b.

In addition to the two variables ayref and aydelta, further variables are delivered to block 310b in order to monitor transverse acceleration sensor 105. These are vehicle velocity vf, signal ayoff which represents the offset of the signal generated with transverse acceleration sensor 105, corrected transverse acceleration sensor signal aykorr, signal omegakorr, signal aymess generated by transverse acceleration sensor 105, corrected steering angle signal deltakorr, and a signal mo2 generated in block 311. Based on these input variables, signals Fay which contain information as to whether transverse acceleration sensor 105 is faulty are generated in block 310b. These signals Fay are delivered to controller core 203.

On the basis of reference variable omegaref and vehicle velocity vf, a sensor reference variable deltaref can be determined in block 309c for steering angle sensor 106, using an inverse mathematical model; this is delivered to a block 310c. In FIG. 4b, block 309c and the input signals omegaref and vf delivered to it, as well as the output signal deltaref generated by it, are depicted with dashed lines, since this manner of generating the sensor reference variable for steering angle sensor 106 constitutes an alternative to the method used in the exemplary embodiment for determining the sensor reference variable for steering angle sensor 106.

In block 310c, monitoring of steering angle sensor 106 takes place. For this reason, sensor reference signal omegaref of rotation rate sensor 104, signal deltaoff which represents the offset of the signal generated by steering angle sensor 106, signal vf representing the vehicle velocity, corrected yaw velocity omegakorr, signal deltamess generated by steering angle sensor 106, and comparison variable omegadelta are delivered to block 310c. By analogy with blocks 310a and 310b, it also conceivable for block 310c to have delivered to it a signal Mo3 which contains information regarding the validity of the mathematical or inverse mathematical models being used.

Signals Mo1, Mo2, and Mo3 are contained in signals Modtruei.

As an alternative to the determination of sensor reference variable deltaref taking place in block 309c, a steering angle reference value is determined in block 310c on the basis of corrected yaw velocity omegakorr and vehicle velocity vf, using an inverse mathematical model. Based on this steering angle reference value, both a monitoring operation of steering angle sensor 106 and an additional monitoring of rotation rate sensor 104 can be performed in block 310c. This additional monitoring of rotation rate sensor 104 would not be possible if sensor reference variable deltaref were used in block 310c instead of the steering angle reference value. Signals Fomega4 and Fdelta generated in block 310c are fed to controller core 203.

The control algorithm executed in controller core 203 is influenced on the basis of signals Fomega, Fay, Fomega4, and Fdelta delivered to it. If controller core 203 is informed, by means of one of these signals, that one of sensors 103ij, 104, 105, or 106 is faulty, fault handling routines can, for example, be invoked in controller core 203.

Invoking such fault handling routines makes it possible, for example, to exclude the signals generated by the faulty sensors from calculation of the variables necessary for control purposes, and replace them with substitute variables determined by using the non-faulty sensors. As an alternative to invoking fault handling routines, a so-called controller emergency mode is also conceivable. In the present exemplary embodiment, for example, in a controller emergency mode of this kind a portion of the system for controlling the operating dynamics of the vehicle, or even the entire system, can be shut down.

In addition, the corrected signals omegakorr, aykorr, deltakorr, and nijkorr are delivered to controller core 203. For the case in which none of the sensors 103ij, 104, 105, or 106 is faulty, all the corrected signals can be processed in controller core 203. As an alternative to the corrected signals, it is also possible to deliver to controller core 203, as already shown in FIG. 3, the signals generated by the sensors as well as the offset signals, from which the corrected signals can then be determined in controller core 203.

Signals Modi are transmitted from controller core 203 to block 311. These signals are incorporated into the test for the validity of the mathematical or inverse mathematical models being used. Signals Modi can, for example, be signals which contain information about the status of the power supply, or information about any short circuits or shunts which may be present, for example, in the sensor lines.

In block 311 a test is made, as a function of signals Modi, corrected signals nijkorr, omegakorr, and deltakorr, sensor reference variable ayref for transverse acceleration sensor 105, vehicle velocity vf, and variables aydelta and nosteilwand, as to whether the mathematical or inverse mathematical models being used possess validity. The result of this test is output via signals Modtruei, which contain signals Mo1, Mo2, and Mo3, and F1, F2, and F3.

A number of possibilities exist for testing the mathematical or inverse mathematical models being used. On the basis of the corrected wheel velocities nijkorr, the mathematical or inverse mathematical models being used are valid if, for example, none of the wheel velocities, decreases too slowly within a specific time period as compared with a defined threshold value; or if, for example, the velocity difference between a front wheel and the rear wheel on the same side is less than a defined threshold value.

On the basis of signal omegakorr, the mathematical or inverse mathematical models being used are valid, for example, if the value of signal omegakorr does not change greatly, as compared with a defined threshold value, within a certain time period.

Further model validity criteria can be derived, for example, from corrected signals ayref and deltakorr. For example, a further prerequisite for validity of the mathematical or inverse mathematical models being used is that the value of signal ayref is less than a threshold value, and/or that the value of signal deltakorr is less than a threshold value. Vehicle velocity vf should also exceed a specific threshold.

Another criterion for validity of the mathematical or inverse mathematical models being used is that, for example, the difference between sensor reference variable ayref and signal aydelta should be less than a defined threshold.

The above-identified test criteria are general criteria valid for all mathematical or inverse mathematical models. As a supplement to these general criteria, it may be advisable to additionally use special criteria, for example for blocks 304a, 304b, and 304c. For example, for the determination of signal ayoff taking place in block 304b, it may be important that the vehicle is not passing through a banked curve. Signal nosteilwand is therefore taken into account in block 311. Additional monitoring criteria result from taking signals Modi into consideration.

On the basis of the various possibilities for model monitoring, it is conceivable for different test criteria taking place in block 311 to be incorporated into signals Mo1, Mo2, and Mo3, and F1, F2, and F3.

Figure 5:
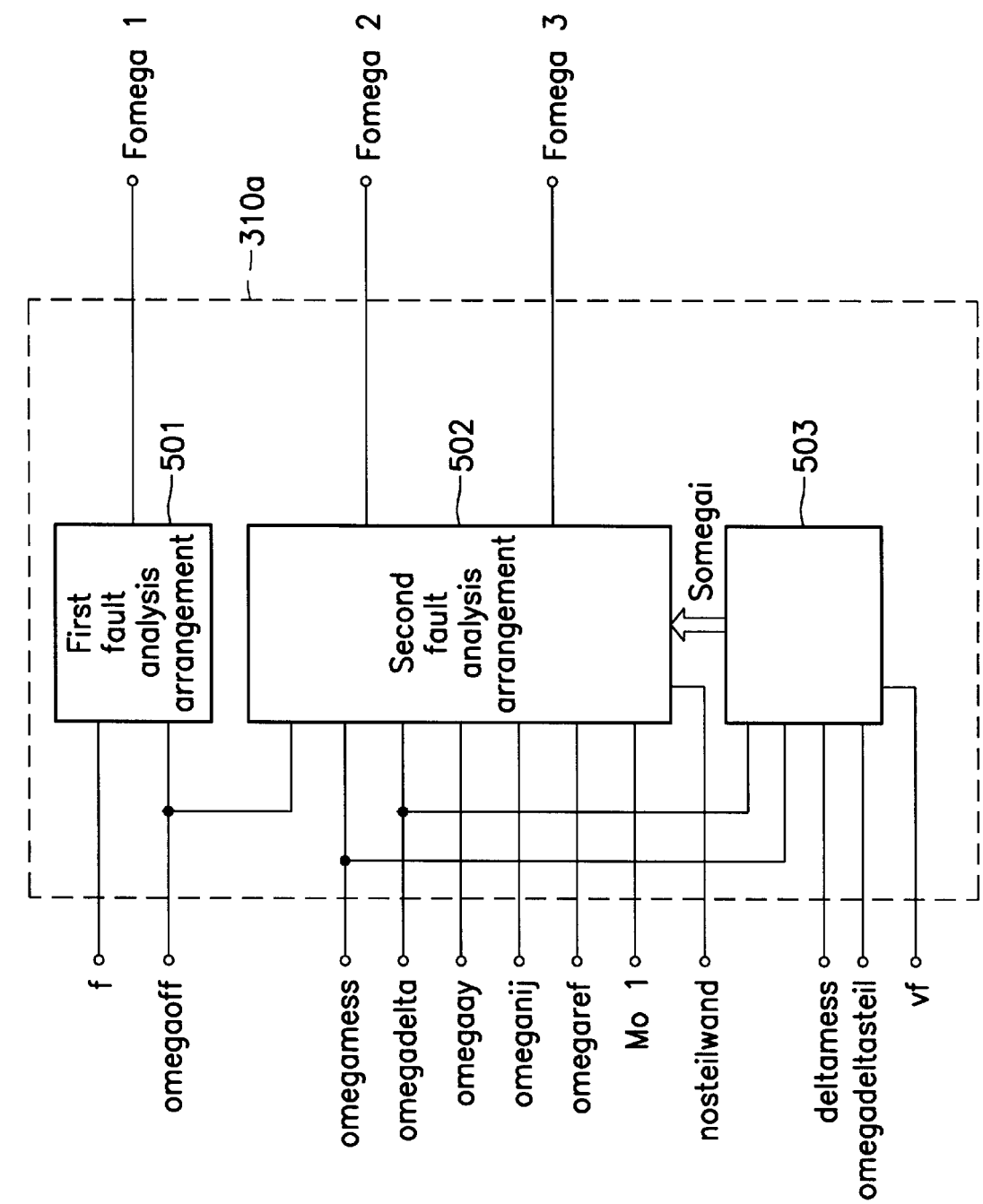
FIG. 5 shows an arrangement for monitoring a rotation rate sensor.

FIG. 5 depicts the layout of block 310a, in which monitoring of rotation rate sensor 104 takes place. On the basis of signals f and omegaoff, a first monitoring operation for rotation sensor 104, capable of determining a first fault of the rotation sensor, takes place in a first fault analysis means (arrangement) 501. This can be done, for example, by testing signals f and omegaoff for plausibility by means of threshold value comparisons. The threshold values used in this context can, for example, be derived from the specifications indicated by the manufacturer of the rotation rate sensor. The result of the plausibility tests is output by means of signal Fomega1. The value TRUE can, for example, be assigned to this signal for the case in which the rotation sensor, on the basis of the plausibility tests, is faulty.

A second monitoring operation for rotation rate sensor 104, capable of determining a second fault of the rotation rate sensor, takes place in a second fault analysis means (arrangement) 502. This is done by delivering signals omegaoff, omegamess, omegadelta, omegaay, omeganij, omegaref, Mo1, nosteilwand, as well as the threshold values necessary for the queries taking place in block 502 or permissible sensor-specific deviations Somegai, to block 502. On the basis of the input signals, two separately executed monitoring operations take place in block 502. One takes place only if the mathematical or inverse mathematical models being used possess validity, and if at the same time a banked curve condition is not present. Model validity is indicated by signal Mo1, and the banked curve condition by signal nosteilwand. With this monitoring operation, it can be ascertained whether or not rotation rate sensor 104 is faulty. The result of this monitoring operation is output by means of signal Fomega2. With a second monitoring operation, which is performed regardless of the validity of the mathematical or inverse mathematical models being used, it is possible to determine whether or not rotation rate sensor 104 is faulty. The result of this monitoring operation is output by means of signal Fomega3. The two monitoring operations taking place in block 502 are shown in more detail in FIGS. 6a and 6b.

In a block 503, the threshold values necessary for the monitoring operations taking place in block 502, or the permissible sensor-specific deviations Somegai, are determined, for example on the basis of signals omegamess, omegadelta, deltamess, omegadeltasteil, and vf. Using variables omegadelta and omegadeltasteil makes it possible additionally to account for any lateral road surface slope that may be present. On the basis of variables omegamess, deltamess, and vf, it is possible also to account, for example, for phase shifts between the yaw velocity and the steering angle during rapid changes in steering angle.

Figure 6A:
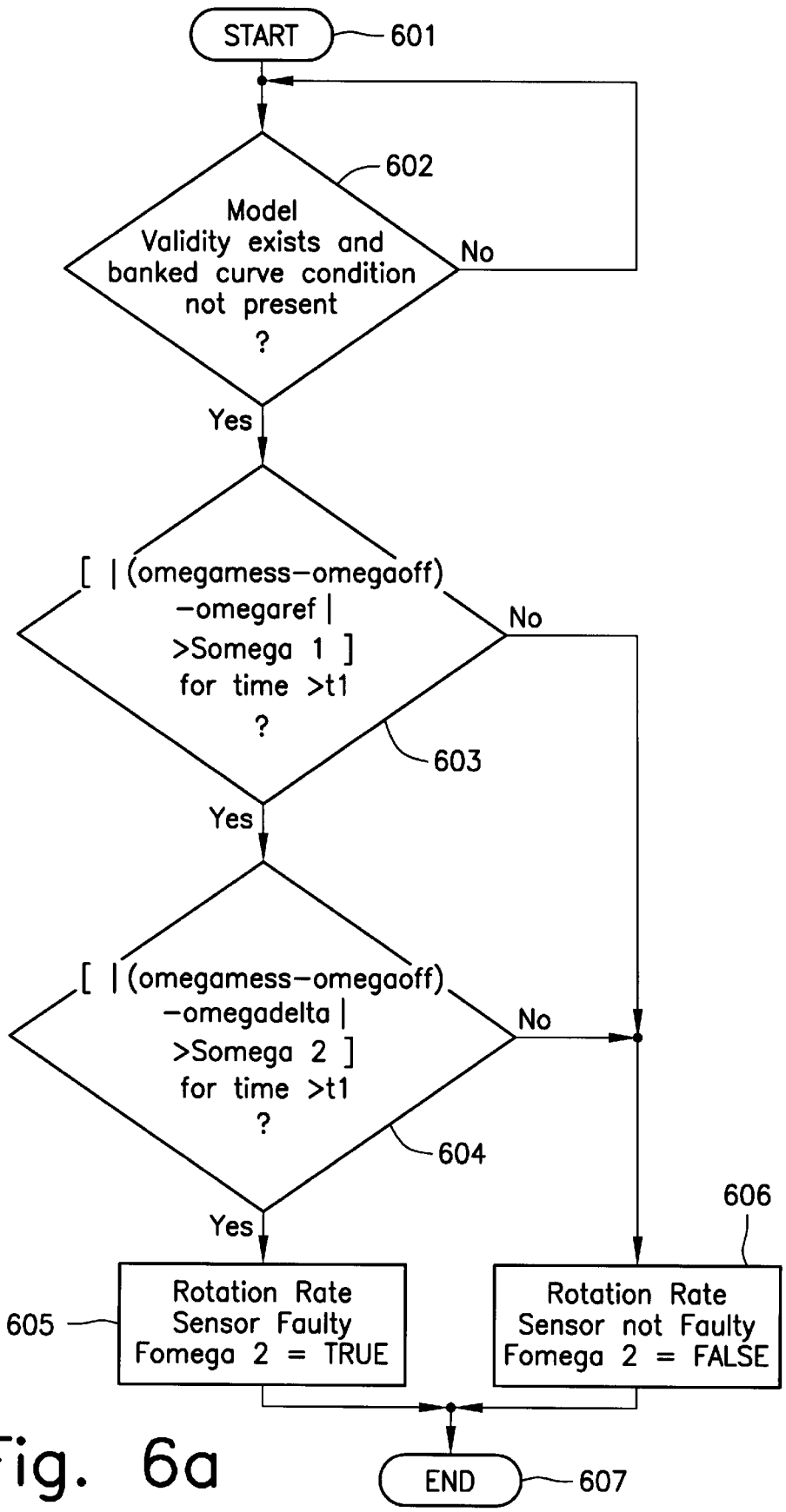
FIG. 6a shows a first flow diagram of a portion of the monitoring operation executed in the arrangement illustrated in FIG. 5.

FIG. 6a shows a flow chart of a first monitoring operation of the monitoring operations taking place in second fault analysis means 502. This first monitoring operation begins at step 601. In the subsequent step 602, a query is made as to whether validity exists for the mathematical or inverse mathematical models being used, and whether a banked curve condition is simultaneously absent. This is done by testing the values of signal Mo1 on the one hand, and signal nosteilwand on the other hand. If model validity does not exist, or if a banked curve condition is present, step 602 is performed again.

If, however, it is ascertained in step 602 both that model validity exists and that no banked curve condition is present, step 603 is then performed next. Step 603 tests whether the time period during which the magnitude of the difference taken between (omegamess-omegaoff) and omegaref is greater than a first threshold Somega1 exceeds a defined, threshold value t1. If the time period thus determined is less than threshold value t1, step 606 is performed next. If, on the other hand, the time period exceeds threshold value t1, step 604 is performed next.

Step 604 tests whether the time period during which the magnitude of the difference taken between (omegamess-omegaoff) and omegadelta is greater than a second threshold Somega2 exceeds a defined threshold value t1. If the time period thus determined is less than threshold value t1, step 606 is performed next. If, on the other hand, the time period exceeds threshold value t1, step 605 is performed next.

In step 605, the value TRUE is assigned to signal Fomega2, since as a result of the queries taking place in steps 603 and 604 it has been established that rotation rate sensor 104 is faulty. Rotation rate sensor 104 is faulty because, on the one hand, it was ascertained in step 603 that the magnitude of the deviation constituted from the signal generated by the rotation rate sensor and offset-corrected, and the sensor reference variable, exceeded a threshold value Somega1 for a time period which was greater than a threshold value t1. On the other hand, it was ascertained in step 604 that the magnitude of the deviation constituted from the signal generated by the rotation rate sensor and offset-corrected, and the comparison variable omegadelta, exceeded a threshold value Somega2 for a time period which was greater than a threshold value t1.

In step 606, the value FALSE is assigned to signal Fomega2, since as a result of the queries taking place in steps 603 and 604 it has been established that the rotation rate sensor is not faulty.

Step 607, at which the first monitoring operation ends, is performed subsequent to step 605 or step 606.

It is evident from the flow chart shown in FIG. 6a that the sensor monitoring operation is performed only if the mathematical or inverse mathematical models being used are valid.

Figure 6B:
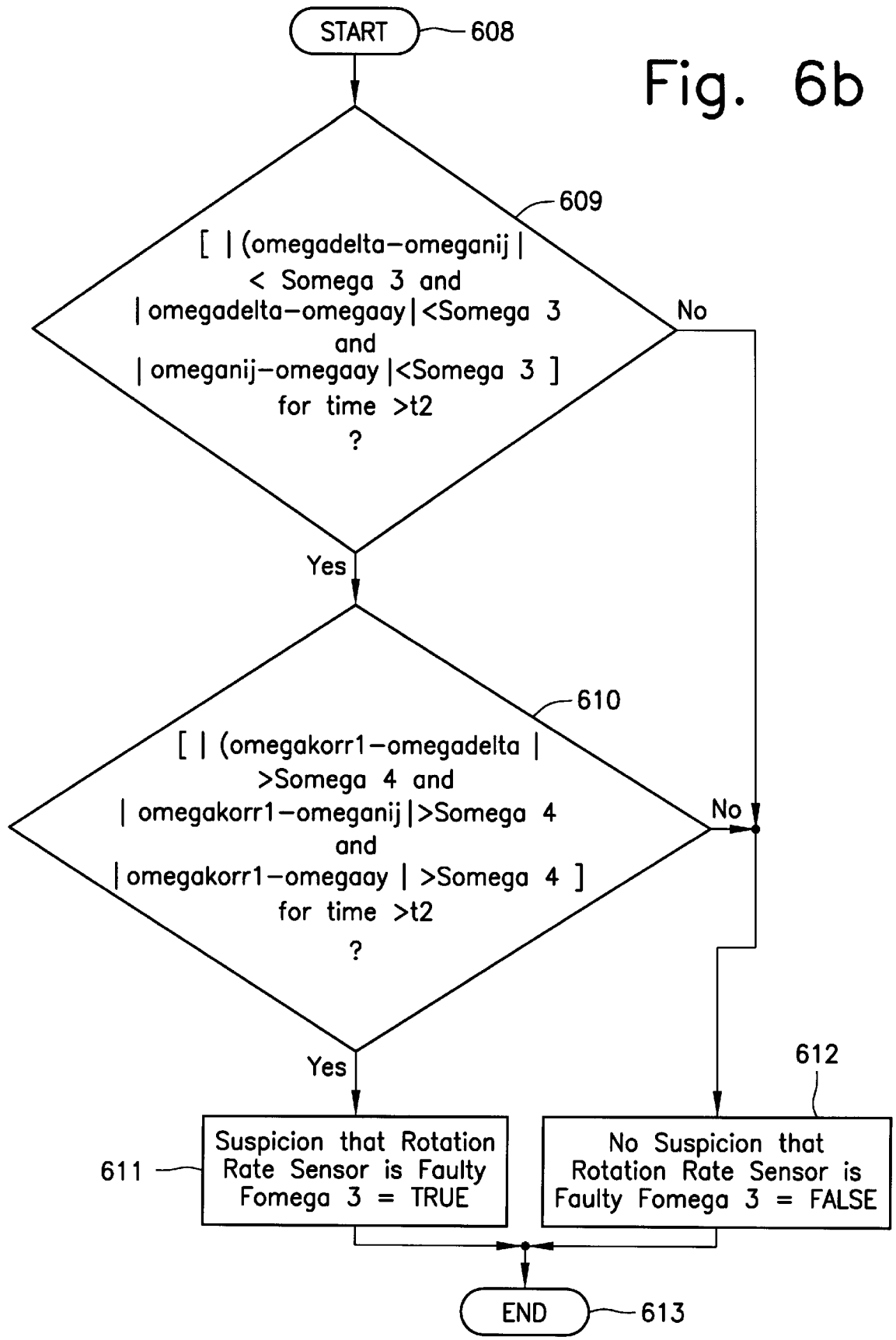
FIG. 6b shows a second flow diagram of the portion of the monitoring operation executed in the arrangement illustrated in FIG. 5.

FIG. 6b shows a flow chart of a second monitoring operation for the rotation rate sensor taking place in second analysis means 502. This second monitoring operation takes place regardless of the validity of the mathematical or inverse mathematical models being used. It is alternatively possible in this second monitoring operation, by analogy with the first monitoring operation, to take into account the existence of a banked curve condition. The second monitoring operation begins with a step 608. Subsequent to this step, step 609 is performed.

Step 609 tests whether the time period in which simultaneously the magnitude of the difference between omegadelta and omeganij is less than Somega3, and the magnitude of the difference between omegadelta and omegaay is less than Somega3, and the magnitude of the difference between omeganij and omegaay is less than Somega3, exceeds a defined threshold value t2. In other words, step 609 tests whether the three comparison variables lie, for a specific time period, in a narrow band of yaw velocities. If it is determined in step 609 that the time period is less than threshold value t2, step 612 is performed next.

If, however, it is determined in step 609 that the time period is greater than threshold value t2, then step 610 is performed next. Step 610 tests whether the time period during which simultaneously the magnitude of the difference between omegakorr1 and omegadelta is greater than Somega4, and the magnitude of the difference between omegakorri and omeganij is greater than Somega4, and the magnitude of the difference between omegakorr1 and omegaay is greater than Somega4, exceeds a defined threshold value t2. Variable omegakorr1 is constituted from signal omegamess (generated by rotation rate sensor 104) and signal omegaoff. In other words, step 610 tests whether the offset-corrected value omegakorr1 has a minimum spacing from the three comparison variables for a specific time period. If the time period determined in step 610 is less than threshold t2, step 612 is performed next. If, on the other hand, the time period is greater than threshold value t2, then step 611 is performed next.

In step 611, the value TRUE is assigned to signal Fomega3, since there exists a suspicion that the rotation rate sensor is faulty. The suspicion exists because on the one hand it was determined in step 609 that the three comparison variables lay in a narrow band of yaw velocities for a specific time period, and on the other hand it was determined in step 610 that the offset-corrected variable omegakorr1 had a minimum spacing from the three comparison variables for a specific time. In step 612, the value FALSE is assigned to signal Fomega3, since there is no suspicion that the rotation rate sensor is faulty. Step 613, which ends the second monitoring operation, is performed subsequent to step 611 and subsequent to step 612.

Threshold values Somega1, Somega2, Somega3, and Somega4 are combined as shown in FIG. 5 into signals Somegai.

Figure 7:
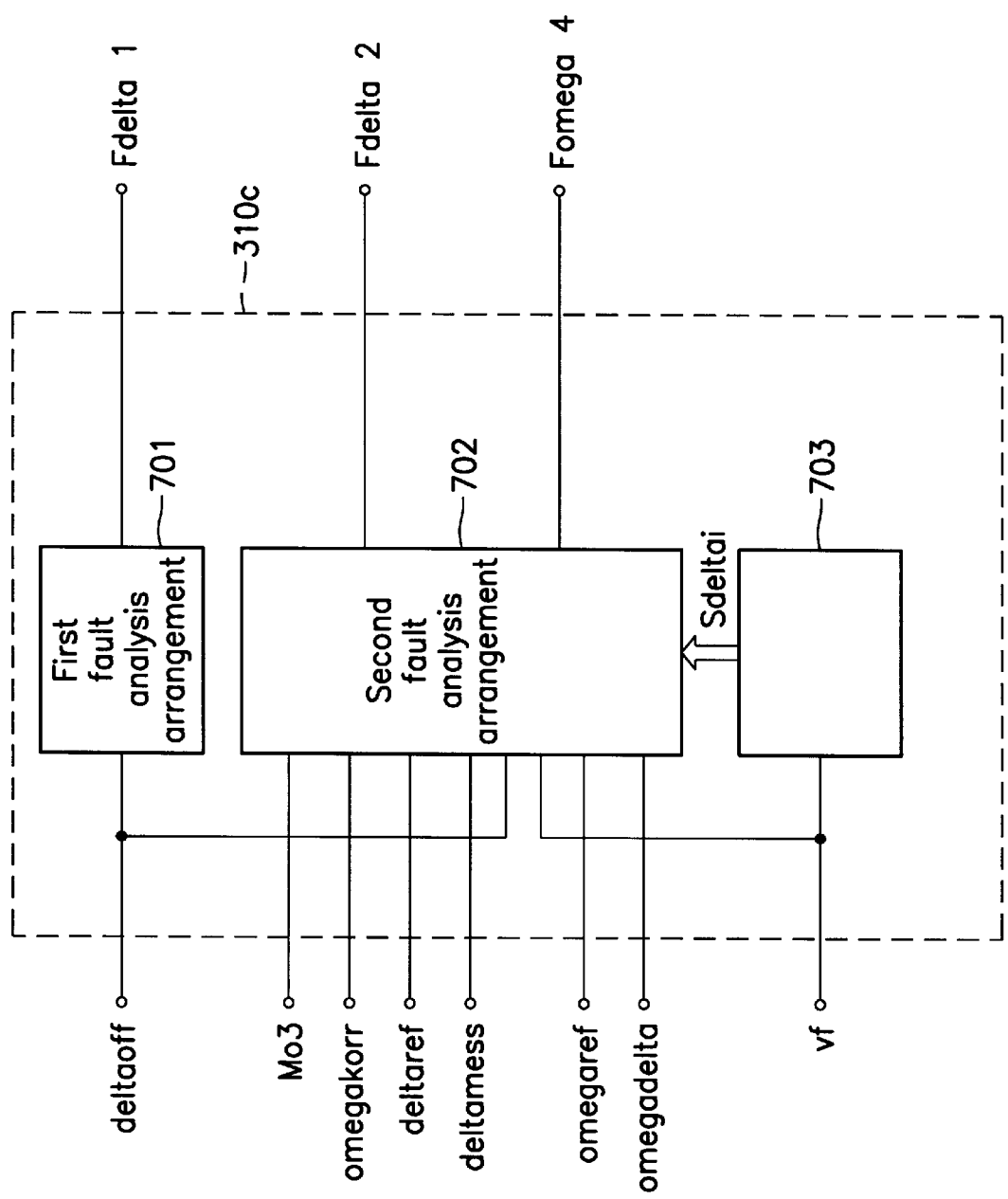
FIG. 7 shows an arrangement for monitoring a steering angle sensor.

FIG. 7 shows an exemplary layout of block 310c. A first fault analysis means (arrangement) 701 determines a first sensor fault on the basis of signal deltaoff, which represents the offset of the signal generated by the steering angle sensor. This is done by testing signal deltaoff for plausibility, for example based on threshold value queries. The threshold values can be derived, for example, from the sensor specifications. The result of this query is output with signal Fdelta1.

A second fault analysis means (arrangement) 702 is capable of determining a second sensor fault of the steering angle sensor, on the basis of input variables omegakorr, deltamess, deltaoff, vf, omegaref, omegadelta, and Sdeltai, and alternatively signals deltaref and Mo3. Second fault analysis means 702 is also capable of determining a fault in the rotation rate sensor. Alternatively, either sensor reference variable deltaref, or a variable deltaomega derived from the corrected yaw velocity omegakorr by means of a mathematical model, can be used for the fault analysis taking place in block 702. The result of the fault analysis for the steering angle sensor is output by means of signal Fdelta2. The result of the fault analysis for the rotation rate sensor is output by means of signal Fomega4.

Threshold values Sdeltai, which are used as permissible, sensor-specific deviations in the queries taking place in second fault analysis means 702, are calculated in a block 703 on the basis of vehicle velocity vf.

Figure 8A:
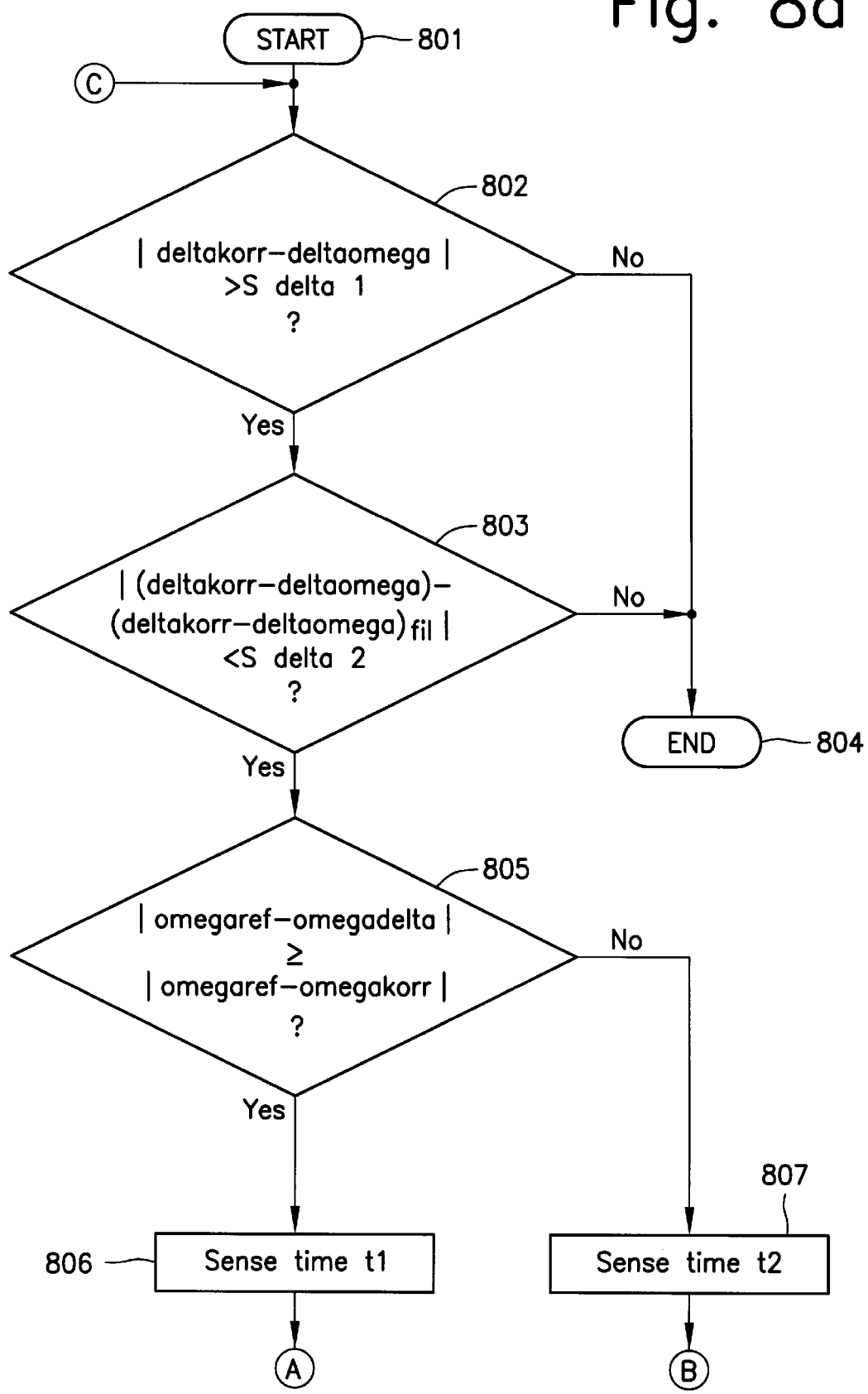
FIG. 8 shows a flow diagram of a portion of the monitoring operation executed in the arrangement illustrated in FIG. 7.
Figure 8B:
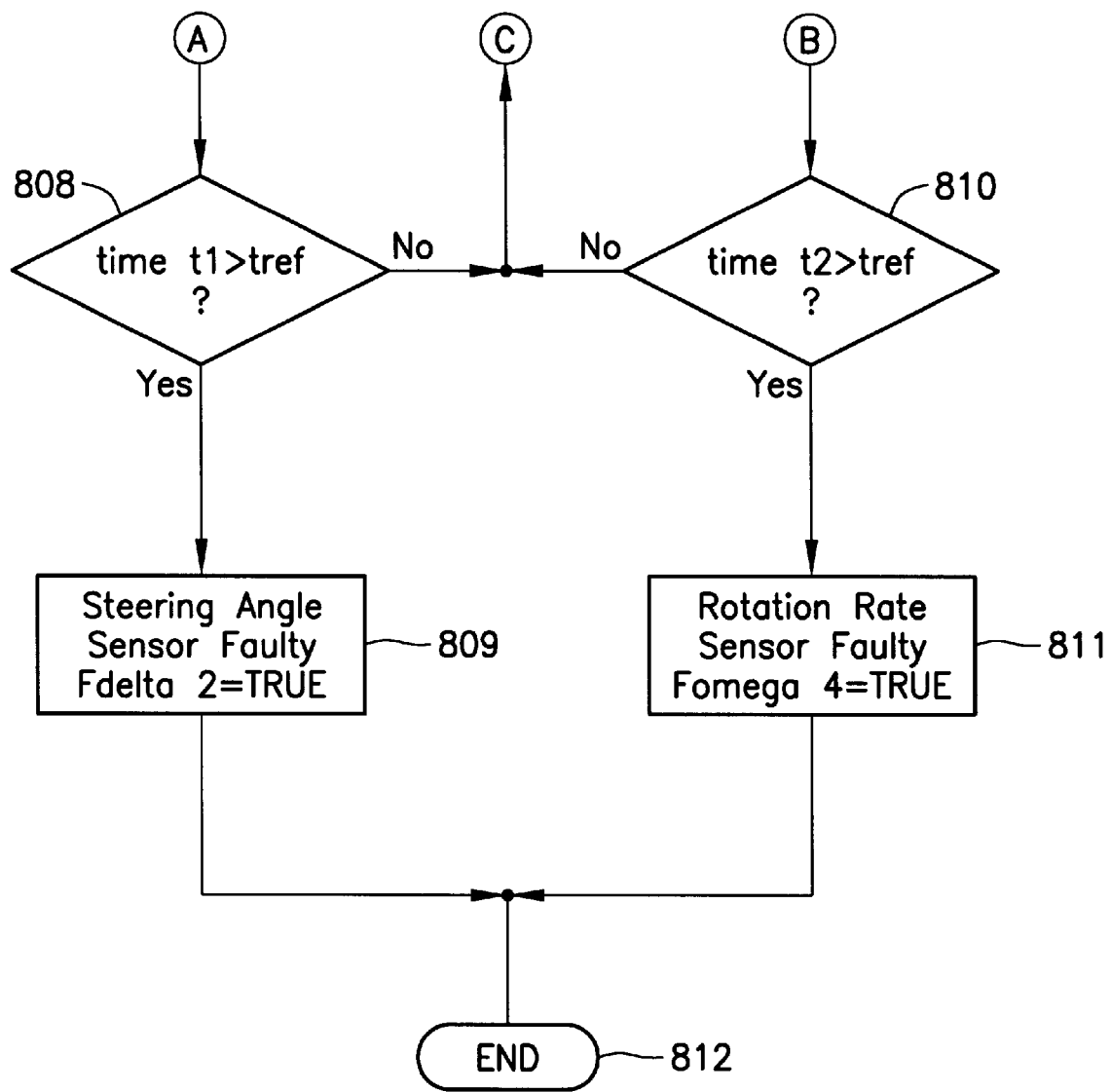

FIGS. 8a and 8b show flow charts of a monitoring operation for the steering angle sensor taking place in second fault analysis means 702. A fault regarding the rotation rate sensor can also be recognized on the basis of this monitoring operation. The monitoring operation begins with step 801, which is followed by step 802.

Step 802 tests whether the magnitude of the difference between variables deltakorr and deltaomega is greater than a threshold value Sdelta1. Variable deltakorr constitutes the signal generated by the steering angle sensor and then offset-corrected, and results from signals deltamess and deltaoff. Variable deltaomega constitutes a reference value for the signal generated by the steering angle sensor, this variable being created on the basis of the corrected yaw velocity omegakorr by means of a mathematical model. As an alternative to variable deltaomega, sensor reference variable deltaref of the steering angle sensor can also be used. If it is ascertained in step 802 that the magnitude is less than the threshold, which means that the signal generated by steering angle sensor 106 is plausible, then step 804 is performed next.

If, however, it is ascertained in step 802 that the magnitude is greater than threshold Sdelta1, which means that the signal generated by steering angle sensor 106 is not plausible, then step 803 is performed next.

In step 803, the operating state of the vehicle is tested for stability. This is done by testing, in step 803, whether the magnitude of the difference between the unfiltered deviation (deltakorr–deltaomega) and the filtered deviation (deltakorr–deltaomega)$_{fil}$ is less than a threshold Sdelta2. If it is ascertained in step 803 that the magnitude is greater than threshold Sdelta2, i.e. if the operating state of the vehicle is not stable, then step 804, which ends the monitoring operation taking place in second fault analysis means 702, is performed next.

If, however, it is ascertained in step 803 that the magnitude is less than threshold Sdelta2, then step 805 is performed next.

Step 805 determines whether the magnitude of the difference between omegaref and omegadelta is greater than or equal to the magnitude of the difference between omegaref and omegakorr.

If the magnitude of the difference between omegaref and omegadelta is greater than or equal to the magnitude of the difference between omegaref and omegakorr—which is the same as saying that a greater deviation is present for the steering angle sensor than for the rotation rate sensor—then step 806 is performed next. In step 806, the time period t1 during which this state is present is sensed. Time sensing can be accomplished, for example by the fact that each time step 806 is invoked, the time is increased by an incremental time step. Subsequent to step 806, step 808 is performed, in which time period t1 is compared with a threshold value tref.

If it is ascertained in step 808 that time period t1 is greater than threshold value tref, which is an indication that the steering angle sensor is faulty, then step 809, in which the value TRUE is assigned to signal Fdelta2, is performed next. Subsequent to step 809, step 812, which ends the monitoring operation, is performed.

If, however, it is ascertained in step 808 that time period t1 is less than threshold value tref, then step 802 is performed again.

If it is ascertained in step 805 that the magnitude of the difference between omegaref and omegadelta is less than the magnitude of the difference between omegaref and omegakorr, the next step performed is then step 807, in which the time t2 during which that state exists is sensed. The sensing of time t2 is accomplished by analogy with the sensing of time t1 in step 806. Subsequent to step 807, step 810 is performed, in which time t2 is compared with threshold value tref. If it is ascertained in step 810 that time t2 is greater than threshold value tref, which is an indication that the rotation rate sensor is faulty, then step 811 is performed next; in this, the value TRUE is assigned to signal Fomega4. Subsequent to step 811, step 812 is performed.

If, however, it is ascertained in step 810 that time t2 is less than threshold value tref, then step 802 is performed again.

Alternatively, a query can take place between steps 801 and 802, using signal Mo3, as to whether the mathematical or inverse mathematical models being used possess validity.

Figure 9:
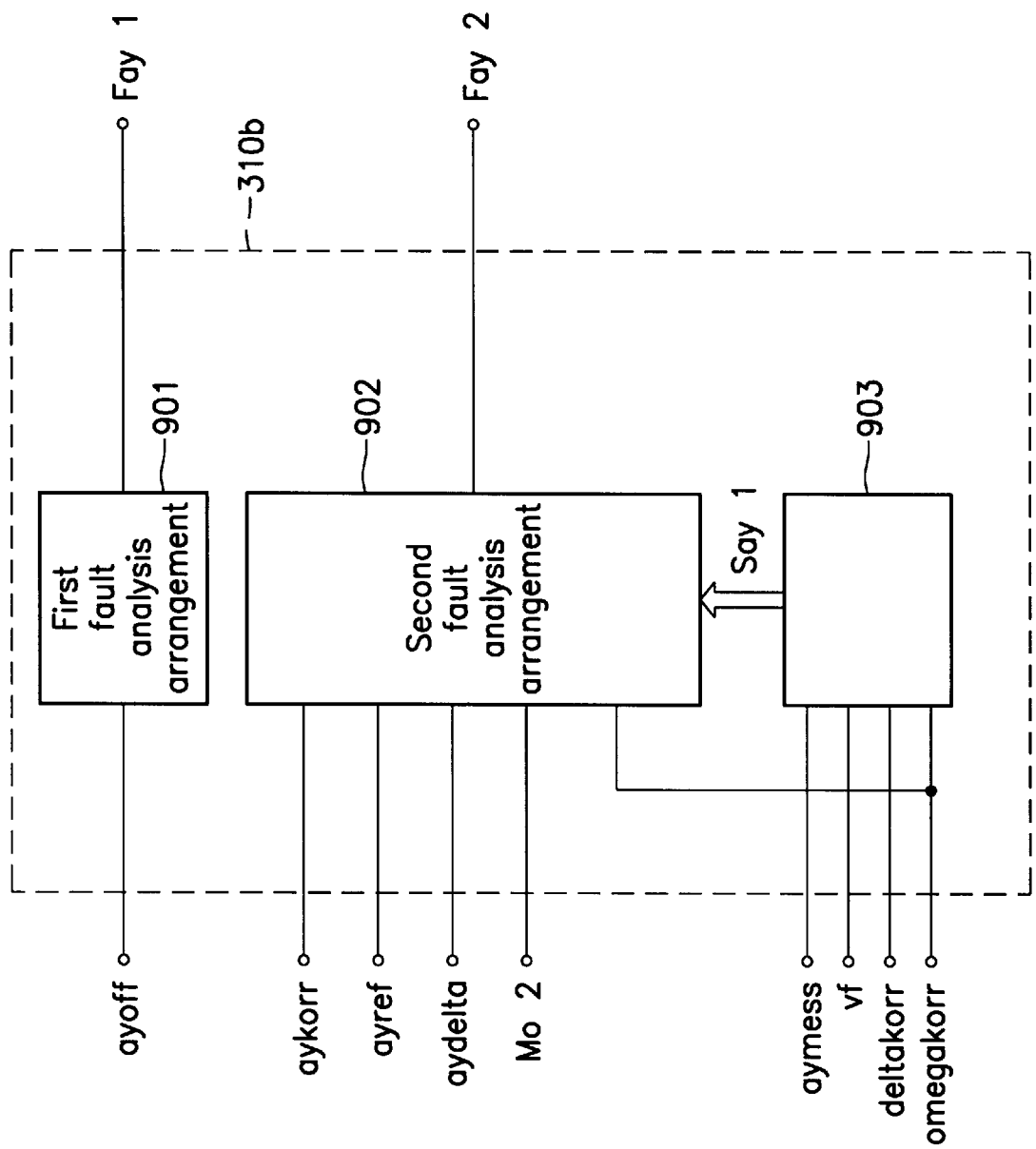
FIG. 9 shows an arrangement for monitoring a transverse acceleration sensor.

FIG. 9 shows an exemplary the layout of block 310$b$.

In a first fault analysis means (arrangement) 901, a first sensor fault can be determined as a function of signal ayoff, which represents the offset of the signal generated by transverse acceleration sensor 105. Determination of the first sensor fault can proceed by analogy with the fault determination operation described for block 701. The result of the determination of the first sensor fault taking place in block 901 is output by means of signal Fay1.

In a second fault analysis means (arrangement) 902, a second sensor fault is determined on the basis of input variables aykorr, ayref, aydelta, Mo2, omegakorr, and variable Say1, by means of plausibility queries. The result of this determination is output by means of signal Fay2.

Threshold Say1, which constitutes a permissible, sensor-specific deviation and is required for the plausibility queries in step 902, is determined in a block 903 on the basis of input variables aymess, vf, deltakorr, and omegakorr.

Figure 10:
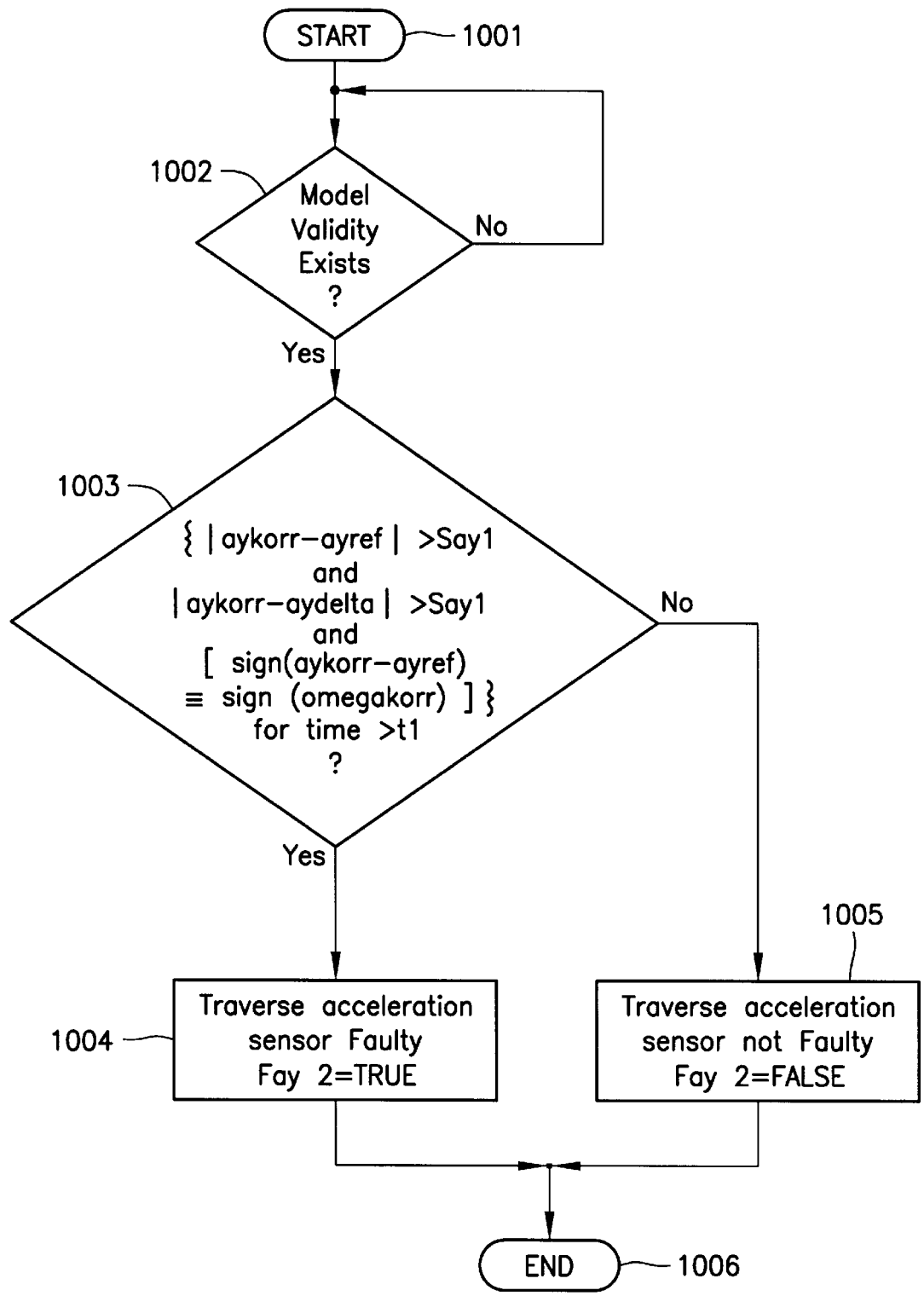
FIG. 10 shows a flow diagram of a portion of the monitoring operation executed in the arrangement illustrated in FIG. 9.

FIG. 10 shows a flow chart of a monitoring operation for transverse acceleration sensor 105 which takes place in second fault analysis means 902.

Monitoring of transverse acceleration sensor 105 begins with step 1001. Subsequent to this step, step 1002 is performed, querying whether validity exists for the mathematical or inverse mathematical models being used. If model validity does not exist, step 1002 is performed again.

If, however, it is ascertained in step 1002 that model validity does exist, then step 1003 is performed next. Step 1003 checks whether the time period during which simultaneously the magnitude of the difference between aykorr and ayref is greater than Say1, and the magnitude of the difference between aykorr and aydelta is greater than Say1, and the difference (aykorr–ayref) and the variable omegakorr have the same sign, exceeds a defined threshold value t1. The third condition is used to recognize sloping road surfaces.

If it is ascertained in the query in step 1003 that the time period exceeds threshold value t1, which is an indication that the transverse acceleration sensor is faulty, the next step performed is then step 1004, in which the value TRUE is assigned to signal Fay2. If, however, it is ascertained in step 1003 that the time period is less than threshold t1, which is an indication that the transverse acceleration sensor is not faulty, then the next step performed is step 1005, in which the value FALSE is assigned to signal Fay2. Subsequent to step 1004 and subsequent to step 1005, step 1006 is performed, terminating the monitoring operation for transverse acceleration sensor 105.

What is claimed is:

1. An apparatus for monitoring sensors in a vehicle, the sensors generating signals representing different physical variables, the apparatus comprising:

a first arrangement determining at least a first comparison variable for a first unit of the sensors and a second comparison variable for a second unit of the sensors, the first and second comparison variables being identically defined and being determined as a function of the signals generated by the first and second units;

a second arrangement determining a reference variable as a function of the first and second comparison variables; and a third arrangement performing the following functions:

monitoring at least one of the sensors as a function of the reference variable, and correcting the signal generated by at least one of the sensors as a function of the reference variable.

2. The apparatus according to claim 1, wherein the second arrangement determines the reference variable by comparing the comparison variables.

3. The apparatus according to claim 2, wherein the second arrangement determines the reference variable by at least one of:

determining a further variable, the further variable being one of the comparison variables that has a greatest distance from a most recently determined reference variable, determining distances between the comparison variables without analyzing the further variable, and generating the reference variable as a function of the comparison variables and as a function of the distances without analyzing the further variable, the reference variable being generated by forming a weighted average.

4. The apparatus according to claim 1, wherein the third arrangement includes a fourth arrangement monitoring at least one unit of the sensors as a function of the reference variable, and a fifth arrangement correcting the signal generated by at least one unit of the sensors as a function of the reference variable to generate a further signal, the signal of the at least one unit of the sensors being corrected as a function of the further signal.

5. The apparatus according to claim 4, wherein the further signal represents an offset of the signal generated by the at least one unit before a correction.

6. The apparatus according to claim 5, wherein the fifth arrangement generates a corrected signal as a function of the further signal and as a function of the signal generated by the sensor before the correction, and wherein at least one of the comparison variables corresponding to a particular sensor of the sensors is determined as a function of the corrected signal of the particular sensor.

7. The apparatus according to claim 5, wherein the further signal is generated by a filtration method based on at least one of the signals from at least one of the sensors.

8. The apparatus according to claim 4, wherein the fourth arrangement includes a sixth arrangement determining a sensor reference variable corresponding to a respective one of the at least one unit of the sensors, the sensor reference variable being determined as a function of the reference variable and being provided to the fifth arrangement.

9. The apparatus according to claim 8, wherein the sensor reference variable is further determined using an inverse mathematical model.

10. The apparatus according to claim 8, wherein the further signal represents an offset of the signal generated by the at least one unit before a correction, and wherein the fourth arrangement includes at least one of:

a first fault analysis arrangement determining a first sensor fault for a respective one of the at least one unit of the sensors, the first sensor fault being determined as a function of the further signal, and a second fault analysis arrangement determining a second sensor fault for a respective one of the at least one unit of the sensors, the second sensor fault being determined as a function of the signal generated by the respective one of the at least one unit, the sensor reference variable, and at least one signal representing a permissible sensor-specific deviation.

11. The apparatus according to claim 1, wherein the comparison variables represent a physical variable.

12. The apparatus according to claim 11, wherein the physical variable corresponds to a further variable being detected by one of the sensors provided in a vehicle.

13. The apparatus according to claim 12, wherein the further variable corresponds to a yaw velocity of the vehicle.

14. The apparatus according to claim 1, wherein the first arrangement receives a first signal, a second signal, a third signal and fourth signals, and wherein:

the first signal is generated by a first sensor, the first signal representing a yaw velocity of a vehicle, the second signal is generated by a second sensor, the second signal representing a transverse acceleration of the vehicle, the third signal is generated by a third sensor, the third signal representing a steering angle, and the fourth signals are generated by fourth sensors, the fourth signals representing respective wheel rotation speeds associated with wheels of the vehicle.

15. The apparatus according to claim 1, wherein the reference variable represents a physical variable.

16. The apparatus according to claim 15, wherein the physical variable corresponds to a further variable detected by one of the sensors provided in a vehicle.

17. The apparatus according to claim 16, wherein the further variable corresponds to a yaw velocity of the vehicle.

18. The apparatus according to claim 1, wherein the comparison variables are determined by mathematical models.

19. The apparatus according to claim 18, wherein the mathematical models are verified by a testing arrangement.

20. The apparatus according to claim 19, wherein at least one of the mathematical models is valid for at least one of the following conditions: a rate of change of at least one of the signals is about the same as a first defined threshold within a time period; a difference between at least two of the signals is no greater than a second defined threshold; and a ratio of change of at least one corrected signal is about the same as a third defined threshold within another time period.

21. The apparatus according to claim 19, wherein the testing arrangement determines if at least one corrected signal is plausible.

22. The apparatus according to claim 19, wherein if the testing arrangement determines that at least one of the mathematical models is not valid, then the reference variable is used until the testing arrangement determines that the at least one mathematical model is valid.

23. The apparatus according to claim 19, wherein the testing arrangement determines if at least one corrected signal is plausible, and if the testing arrangement determines that at least one of the mathematical models is not valid, then the reference variable is used until the testing arrangement determines that the at least one mathematical model is valid, and the at least one of the mathematical models is valid for at least one of the following conditions: a rate of change of at least one of the signals is about the same as a first defined threshold within a time period; a difference between at least two of the signals is no greater than a second defined threshold; and a ratio of change of at least one corrected signal is about the same as a third defined threshold within another time period.

24. A method for monitoring sensors in a vehicle, the sensors generating signals, each of the signals representing a different physical variable, the method comprising the steps of:

determining at least a first comparison variable for a first unit of the sensors and a second comparison variable for a second unit of the sensors, the comparison variables being identically defined and being determined as a function of the signals generated by the first and second units;

determining a reference variable as a function of the first and second comparison variables; and performing the following steps:
monitoring the signal generated by at least one of the sensors as a function of the reference variable, and correcting the signal generated by the at least one of the sensors.

25. An apparatus for monitoring sensors, the sensors being arranged in a vehicle and generating signals, the sensors including a rotation rate sensor generating a first signal, a steering angle sensor generating a second signal, a transverse acceleration sensor generating a third signal, and wheel rotation speed sensors generating fourth signals, each of the wheel rotation speed sensors being associated with a respective one of the wheels of the vehicle, the apparatus comprising:

an arrangement performing the functions of monitoring the sensors and compensating the signals generated by the sensors as a function of the first, second, third and fourth signals.

26. The apparatus according to claim 25, wherein the rotation rate sensor is a yaw rate sensor.

27. An apparatus for monitoring sensors in a vehicle, the sensors generating signals representing different physical variables, the apparatus comprising:

means for determining at least a first comparison variable for a first unit of the sensors and a second comparison variable for a second unit of the sensors, the first and second comparison variables being identically defined and being determined based on the signals generated by the first and second units;

means for determining a reference variable based on the first and second comparison variables; and means for performing the functions of monitoring at least one of the sensors based on the reference variable and correcting at least one of the signals generated by at least one of the sensors based on the reference variable.

28. An apparatus for monitoring sensors, the sensors being arranged in a vehicle and generating signals, the sensors including a rotation rate sensor generating a first signal, a steering angle sensor generating a second signal, a transverse acceleration sensor generating a third signal, and wheel rotation speed sensors generating fourth signals each of the wheel rotation speed sensors being associated with a respective one of wheels of the vehicle, the apparatus comprising:

means for monitoring the sensors and for compensating the signals generated by the sensors based on the first, second, third and fourth signals.

29. An apparatus for monitoring sensors in a vehicle, the sensors generating signals representing different physical variables, the apparatus comprising:

a first arrangement determining at least a first comparison variable for a first unit of the sensors and a second comparison variable for a second unit of the sensors, the first and second comparison variables being identically defined and being determined as a function of the signals generated by the first and second units;

a second arrangement determining a reference variable as a function of the first and second comparison variables; and a third arrangement for correcting the signal generated by at least one of the sensors as a function of the reference variable.

* * * * *

UNITED STATES PATENT AND TRADEMARK OFFICE
CERTIFICATE OF CORRECTION

PATENT NO.   : 6,122,577  
DATED        : September 19, 2000  
INVENTOR(S)  : Mergenthaler et al.

Page 1 of 1

It is certified that error appears in the above-identified patent and that said Letters Patent is hereby corrected as shown below:

Column 4,
Line 67, change "... consists substantially of ..." to -- includes --.

Column 6,
Line 62, change "... go so far as to..." to -- possibly --.

Column 7,
Line 2, change "... Mod1..." to -- Modi --.

Column 8,
Line 54, change "... said..." to -- this --..

Signed and Sealed this

Eleventh Day of September, 2001

Attest:

NICHOLAS P. GODICI  
*Attesting Officer*   *Acting Director of the United States Patent and Trademark Office*